United States Patent
Chang

(10) Patent No.: US 12,224,241 B2
(45) Date of Patent: Feb. 11, 2025

(54) SEMICONDUCTOR DEVICE AND MANUFACTURING METHOD THEREOF INCLUDING A CONDUCTIVE-MATERIAL ETCHING PROCESS TO FURTHER ADJUST A VIA SHAPE

(71) Applicant: TAIWAN SEMICONDUCTOR MANUFACTURING COMPANY, LTD., Hsinchu (TW)

(72) Inventor: Shih-Ming Chang, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 306 days.

(21) Appl. No.: 17/725,300

(22) Filed: Apr. 20, 2022

(65) Prior Publication Data

US 2023/0163071 A1 May 25, 2023

Related U.S. Application Data

(60) Provisional application No. 63/282,035, filed on Nov. 22, 2021.

(51) Int. Cl.
*H01L 23/528* (2006.01)
*H01L 21/768* (2006.01)
(Continued)

(52) U.S. Cl.
CPC .... *H01L 23/5283* (2013.01); *H01L 21/76805* (2013.01); *H01L 21/76895* (2013.01); *H01L 23/5226* (2013.01); *H01L 23/535* (2013.01)

(58) Field of Classification Search
CPC ......... H01L 21/76805; H01L 21/76895; H01L 23/5283; H01L 23/5226; H01L 23/535;
(Continued)

(56) References Cited

U.S. PATENT DOCUMENTS 9,287,286 B2 3/2016 Kim et al.
10,551,736 B2 2/2020 Finders et al.
(Continued)

FOREIGN PATENT DOCUMENTS

KR 1020140055183 A 5/2014
KR 101660944 B1 9/2016
(Continued)

OTHER PUBLICATIONS

US 11,653,505 B2, 05/2023, Castro et al. (withdrawn)

*Primary Examiner* — Britt D Hanley
*Assistant Examiner* — Vicki B Booker
(74) *Attorney, Agent, or Firm* — STUDEBAKER & BRACKETT PC

(57) ABSTRACT

In a method of manufacturing a semiconductor device, a first conductive pattern is formed in a first interlayer dielectric (ILD) layer disposed over a substrate, a second ILD layer is formed over the first conductive pattern and the first ILD layer, a via contact is formed in the second ILD layer to contact an upper surface of the first conductive pattern, a second conductive pattern is formed over the via contact wherein a part of an upper surface of the via contact is exposed from the second conductive pattern in plan view, a part of the via contact is etched by using the second conductive pattern as an etching mask, thereby forming a space between the via contact and the second ILD layer, and a third ILD layer is formed over the second ILD layer.

20 Claims, 22 Drawing Sheets

(51) Int. Cl.
*H01L 23/522* (2006.01)
*H01L 23/535* (2006.01)

(58) Field of Classification Search
CPC ......... H01L 23/53242; H01L 23/53228; H01L 21/7682; H01L 21/76885; H01L 21/76804; H01L 21/76897; H01L 21/76816; H01L 21/31144; H01L 21/76877; H01L 21/823475
See application file for complete search history.

(56) References Cited

U.S. PATENT DOCUMENTS

| | | |
|---|---|---|
| 11,177,228 B2 | 11/2021 | Wu et al. |
| 2003/0036260 A1* | 2/2003 | Nakamura ........ H01L 21/76802 438/622 |
| 2008/0093743 A1 | 4/2008 | Yang et al. |
| 2009/0283833 A1* | 11/2009 | Bach ..................... H10B 43/30 257/773 |
| 2010/0202208 A1 | 8/2010 | Endo et al. |
| 2010/0308469 A1 | 12/2010 | Tsai et al. |
| 2011/0001243 A1 | 1/2011 | Sel et al. |
| 2011/0018036 A1 | 1/2011 | Hwang et al. |
| 2019/0385910 A1* | 12/2019 | Lai ..................... H01L 21/7682 |
| 2020/0126914 A1 | 4/2020 | Chang et al. |
| 2021/0296231 A1 | 9/2021 | Karpov et al. |
| 2022/0230956 A1* | 7/2022 | Noh ................. H01L 21/76883 |

FOREIGN PATENT DOCUMENTS

| | | |
|---|---|---|
| TW | 201411277 A | 3/2014 |
| TW | 201906126 A | 2/2019 |
| TW | 202131494 A | 8/2021 |

* cited by examiner

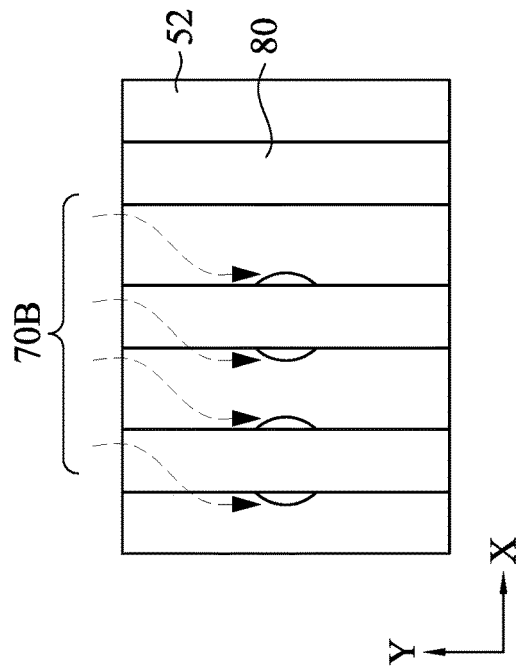
FIG. 10A
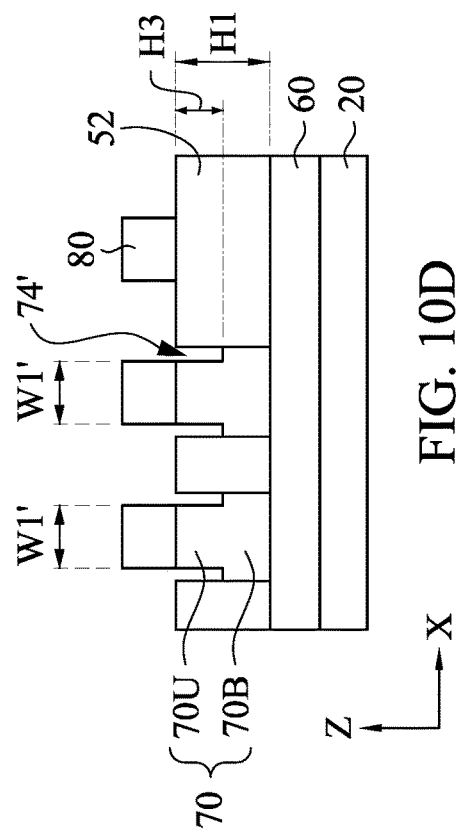
FIG. 10C
FIG. 10D
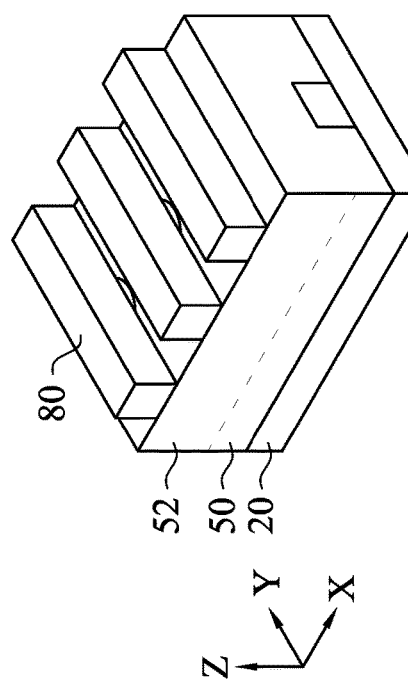
FIG. 10B
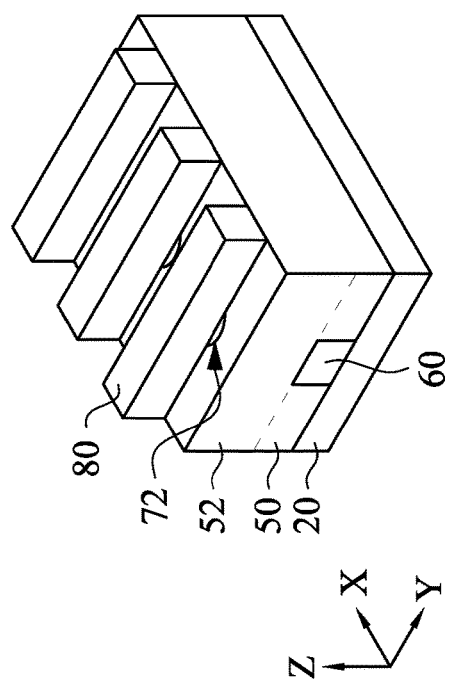

SEMICONDUCTOR DEVICE AND MANUFACTURING METHOD THEREOF INCLUDING A CONDUCTIVE-MATERIAL ETCHING PROCESS TO FURTHER ADJUST A VIA SHAPE

RELATED APPLICATIONS

This application claims the priority of U.S. Provisional Application No. 63/282,035 filed on Nov. 22, 2021, the entire contents of which application are incorporated herein by reference.

BACKGROUND

Semiconductor devices (integrated circuits) include multiple wiring layers having wiring patterns and via contacts connecting vertically adjacent wiring patterns to achieve complex circuitry functions. In forming a via contact and a metal wiring during semiconductor device fabrication, improved overlay control is desired. A damascene process, in particular, a dual damascene process, is widely used to form a via contact and a metal wiring. However, further improvement in the wiring layer formation process is still required to fabricate advanced semiconductor devices.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 10A, 10B, 10C, 10D, 10E and 10F show views of the various stages of a sequential manufacturing operation of a semiconductor device in accordance with embodiments of the present disclosure.

DETAILED DESCRIPTION

Figure 1:
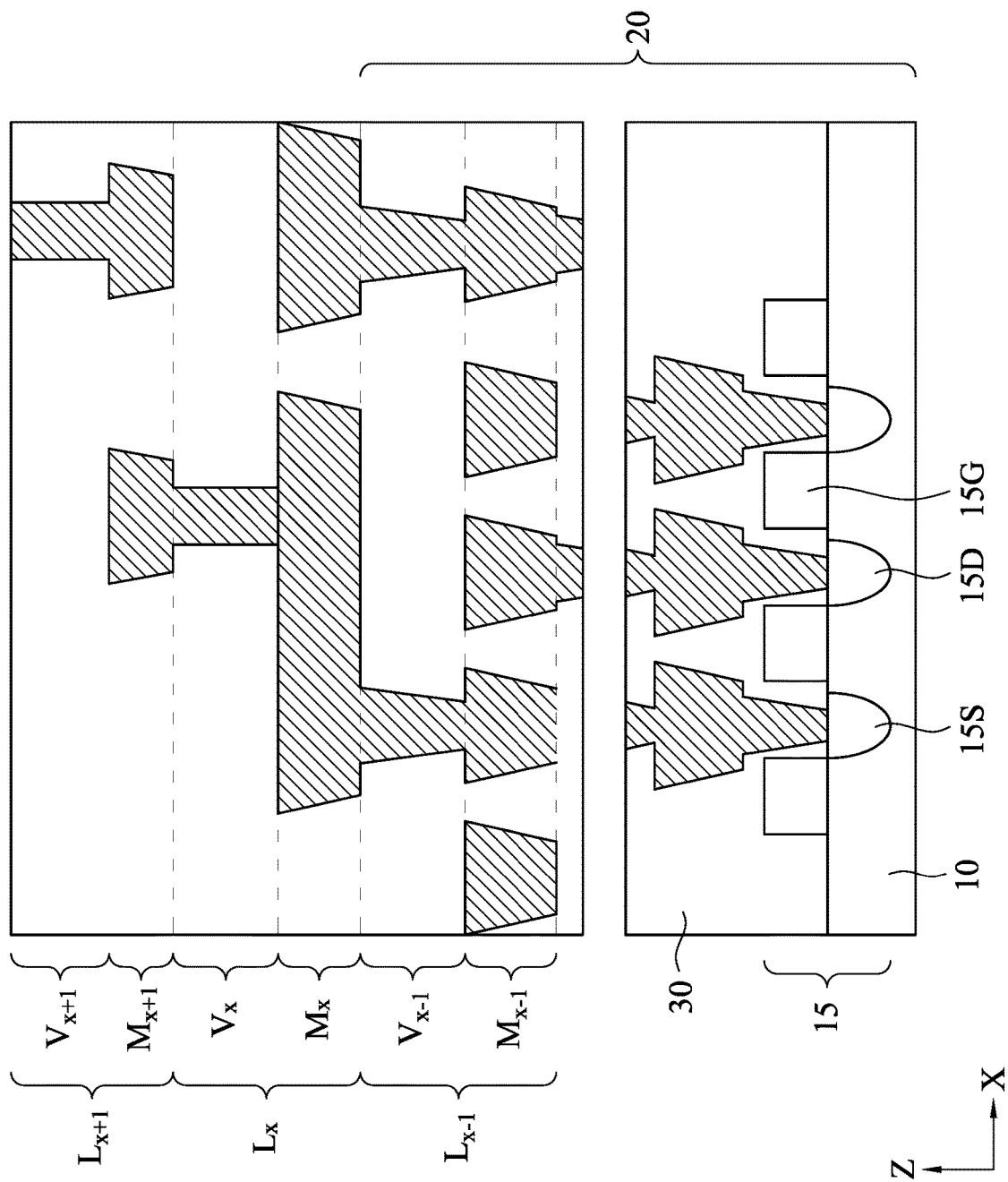
FIG. 1 is a cross sectional view of a semiconductor device in accordance with embodiments of the present disclosure.

It is to be understood that the following disclosure provides many different embodiments, or examples, for implementing different features of the invention. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity. In the accompanying drawings, some layers/features may be omitted for simplification.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device may be otherwise oriented (rotated 90 degrees or at other orientations) and the spatially relative descriptors used herein may likewise be interpreted accordingly. In addition, the term "made of" may mean either "comprising" or "consisting of." Further, in the following fabrication process, there may be one or more additional operations in/between the described operations, and the order of operations may be changed. The numerical values, ranges, dimensions, material, processes, configurations and/or arrangements described below are mere examples and not limited to those disclosed, and other values, ranges, dimensions, material, processes, configurations and/or arrangements may be within the scope of the present disclosure, unless otherwise explained.

In the back-end-of-line (BEOL) process for forming metal wiring layers, a dual damascene process is used, in which trenches for metal lines (conductive wiring patterns) and holes for via contacts are fabricated, and then the trenches and the holes are filled with conductive material at the same time. In the dual damascene process, a via contact and a metal wiring pattern disposed over the via contact (i.e., the metal wiring layer is above the via contact) are formed at the same time. As the critical dimensions (CDs) of the trenches and/or the holes become smaller, it is more difficult to fill the very narrow trenches and holes with conductive material. Further, an overlay error between the via contact and the metal layer (formed over the via contact) in the dual damascene process may cause either a high electrical resistance or an electrical short circuit. The via contact overlay error may also induce a smaller space between the metal wiring patterns on the same level, which may increase the risk of an electrical short circuit. In addition, the via contact overlay error combined with over-etching during formation of the hole for the via contact may induce a cross layer tunnel and cause an electrical short circuit.

In the present disclosure, a novel process to form metal wiring patterns and via contacts by using a conductive material etching process to further adjust the shape of the via, which can reduce various effect caused by an overlay error is provided. Both the via contacts and the metal wiring patterns can be formed by a conductive material filling process, such as a damascene process, or a conductive material etching process. In particular, the present embodiments provide a self-aligned process between a via contact and a metal wiring pattern disposed above the via contact. More specifically, the via contacts below are modified by the metal wiring patterns above, or the etching masks above.

FIG. 1 is a cross sectional view of a semiconductor device including multiple wiring layers in accordance with embodiments of the present disclosure.

In some embodiments, transistors 15, such as field effect transistors (FETs), are disposed over a substrate 10. In some embodiments, the FET 15 includes a gate electrode 15G, a source 15S and a drain 15D. In the present disclosure, a source and a drain are interchangeably used and may have the same structure. In some embodiments, the FET is a planar FET, a fin FET (Fin FET) or a gate-all-around (GAA) FET. In some embodiments, one or more interlayer dielectric (ILD) layers 30 are formed over the FETs.

In some embodiments, the substrate 10 may be made of a suitable elemental semiconductor, such as silicon, diamond or germanium; a suitable alloy or compound semiconductor, such as Group-IV compound semiconductors (e.g., silicon germanium (SiGe), silicon carbide (SiC), silicon germanium carbide (SiGeC), GeSn, SiSn, SiGeSn), Group III-V compound semiconductors (e.g., gallium arsenide, indium gallium arsenide (InGaAs), indium arsenide, indium phosphide, indium antimonide, gallium arsenic phosphide, or gallium indium phosphide), or the like. The substrate 10 includes isolation regions in some embodiments, such as a shallow trench isolation (STI), located between active regions and separating one or more electronic elements from other electronic elements.

In some embodiments, multiple wiring layers $L_x$ (x-th wiring layer) are formed over the FETs, where x is 1, 2, 3, . . . , as shown in FIG. 1. Each of the wiring layers $L_x$ includes conductive wiring pattern $M_x$ and via contacts $V_x$ connected above the wiring patterns $M_x$, and each of the wiring layers $L_{x+1}$ ((x+1)-th wiring layer) includes conductive wiring pattern $M_{x+1}$ and via contacts $V_{x+1}$ connected above the wiring patterns $M_{x+1}$. Similarly, the wiring layers $L_{x-1}$ includes conductive wiring pattern $M_{x-1}$ and via contacts $V_{x-1}$ connected above the wiring patterns $M_x-1$.

In some embodiments, when the wiring layers $L_x$ include wiring patterns $M_x$ extending in the X direction, the wiring layers $L_{x+1}$ include wiring patterns $M_{x+1}$ extending in the Y direction. In other words, X-direction metal wiring patterns and Y-direction metal wiring patterns are alternately stacked in the vertical direction. In some embodiments, x is up to 20. In some embodiments, the wiring layer $L_1$ can include the closest wiring patterns $M_1$ to the FETs 15 except for local interconnects. Each of the wiring layers $L_x$ also includes one or more ILD layers or inter-metal dielectric (IMD) layers. In other embodiments, the wiring layer can include via contacts formed above the metal wiring patterns.

FIGS. 2A-2D to FIG. 7G show various stages of a sequential manufacturing operation of a semiconductor device in accordance with embodiments of the present disclosure. It is understood that additional operations can be provided before, during, and after processes shown by FIGS. 2A-7G, and some of the operations described below can be replaced or eliminated, for additional embodiments of the method. The order of the operations/processes may be interchangeable. In FIGS. 2A-7D, the "A" figures and "B" figures are perspective views, and the "C" figures are plan views (views from the top) and the "D" figures are cross sectional views along the X direction.

Figure 2C:
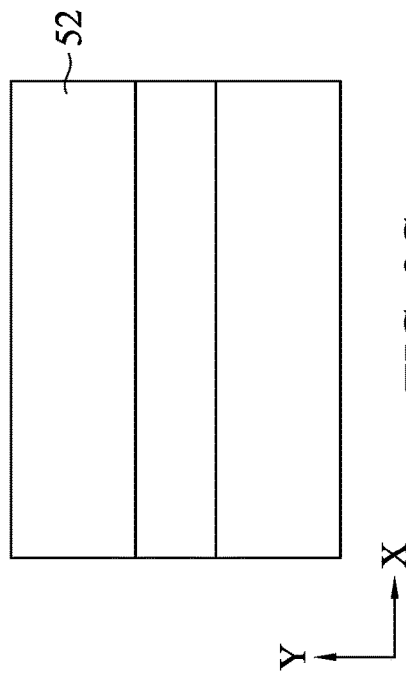
FIGS. 2A, 2B, 2C and 2D show views of the various stages of a sequential manufacturing operation of a semiconductor device in accordance with embodiments of the present disclosure.
Figure 2D:
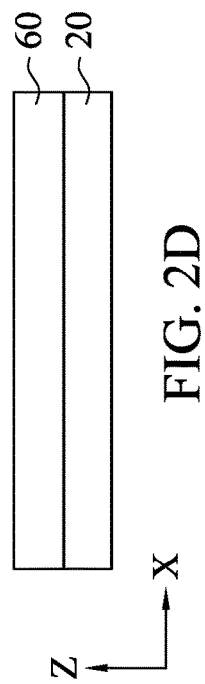
Figure 2A:
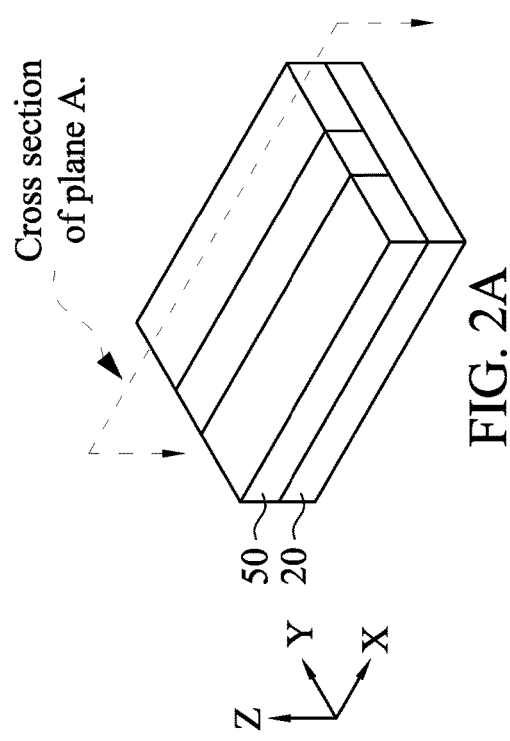
Figure 2B:
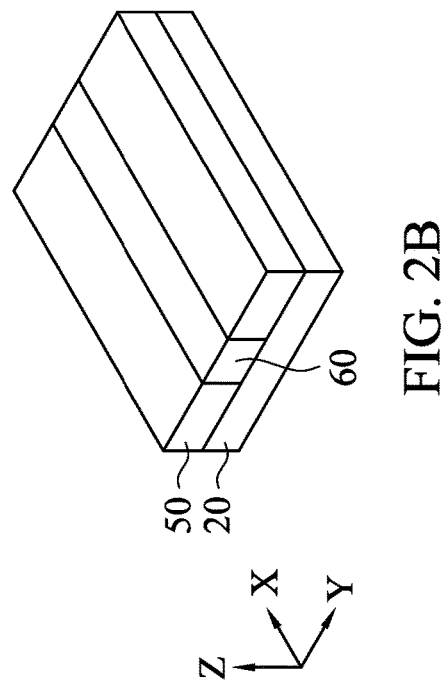

As shown in FIGS. 2A-2D, one or more first wiring patterns (first conductive patterns) 60 extending in the X direction is formed in a first interlayer dielectric (ILD) layer 50 disposed over an underlying structure 20 (see, FIG. 1) disposed over the substrate 10. FIGS. 2A and 2B also show a plane corresponding to the cross section of FIG. 2D (and the "D" figures). The first ILD layer 50 includes one or more dielectric layers disposed over the FETs as shown in FIG. 1. In some embodiments, the first wiring pattern 60 is formed over the underlying structure 20 and embedded in the first ILD layer 50. The first wiring pattern 60 corresponds to, for example, the wiring layer $M_x$ shown in FIG. 1 in some embodiments, or local interconnects directly disposed on the source and/or drain of the FETs.

In some embodiments, the first wiring pattern 60 includes one or more layers of conductive material, such as Cu, Al, Ru, W, Co, Ti or Ta or an alloy thereof. In some embodiments, the thickness of the first wiring pattern 60 is in a range from about 20 nm to about 200 nm. When the first wiring pattern is made of a single metal element, the purity of the metal element is more than 99% in some embodiments. In some embodiments, the purity is less than 100% and the first wiring pattern may include an impurity, such as carbon. In some embodiments, Ru, Co or Cu is used. In some embodiments, the first wiring pattern 60 is formed by chemical vapor deposition (CVD), physical vapor deposition (PVD) including sputtering, plating or atomic layer deposition (ALD).

In some embodiments, the first ILD layer 50 includes one or more layers of silicon oxide, SiON, SiOCN, SiCN, SiOC, silicon nitride, an organic material, a low-k dielectric material, or an extreme low-k dielectric material. In some embodiments, the first wiring pattern 60 is formed by a damascene process such that the upper surface of the first wiring pattern 60 is substantially flush with the upper surface of the first ILD layer 50.

Figure 3A:
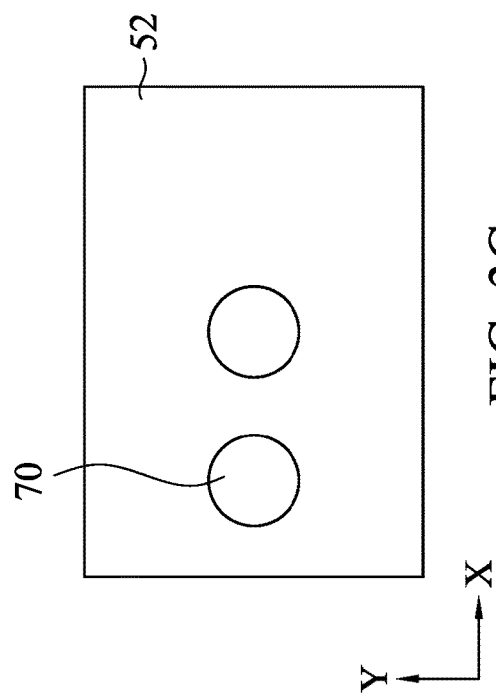
FIGS. 3A, 3B, 3C and 3D show views of the various stages of a sequential manufacturing operation of a semiconductor device in accordance with embodiments of the present disclosure.
Figure 3C:
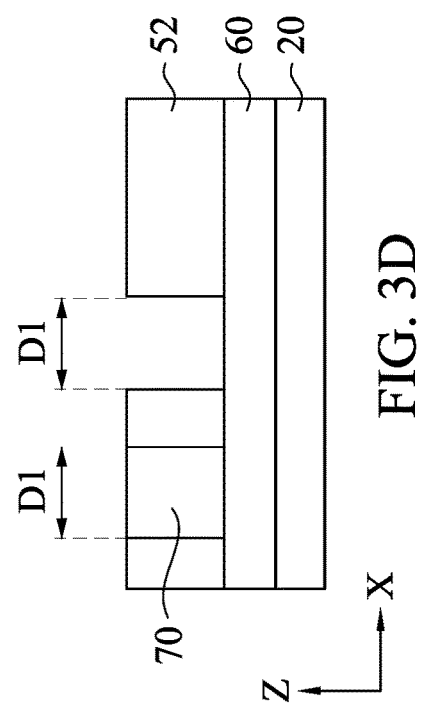
Figure 3B:
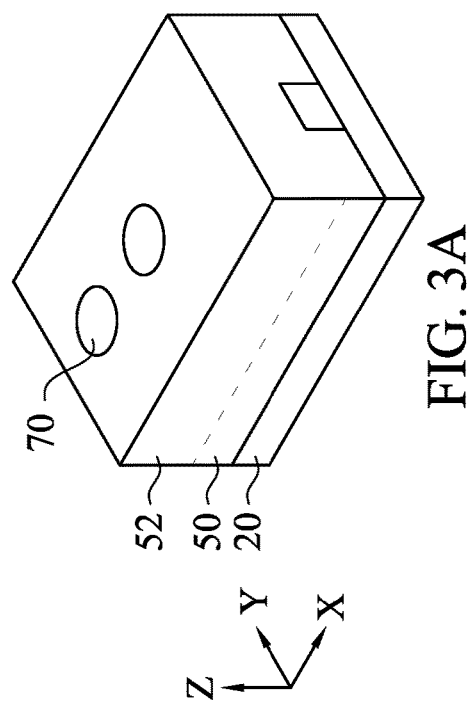
Figure 3D:
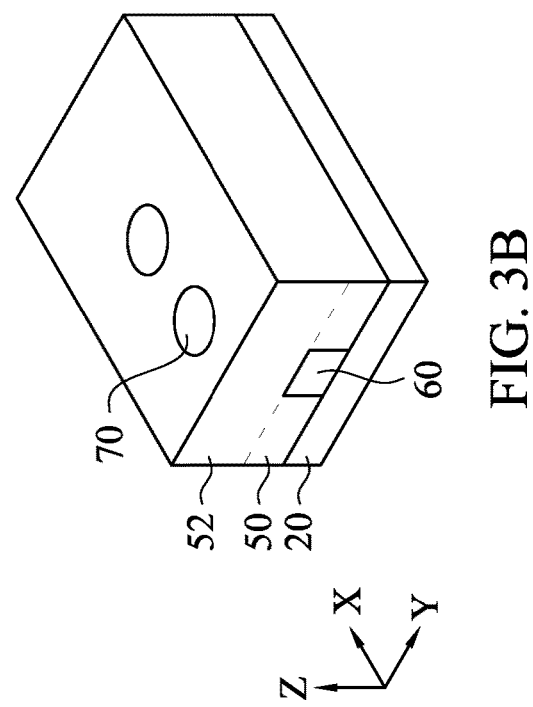
Figure 4C:
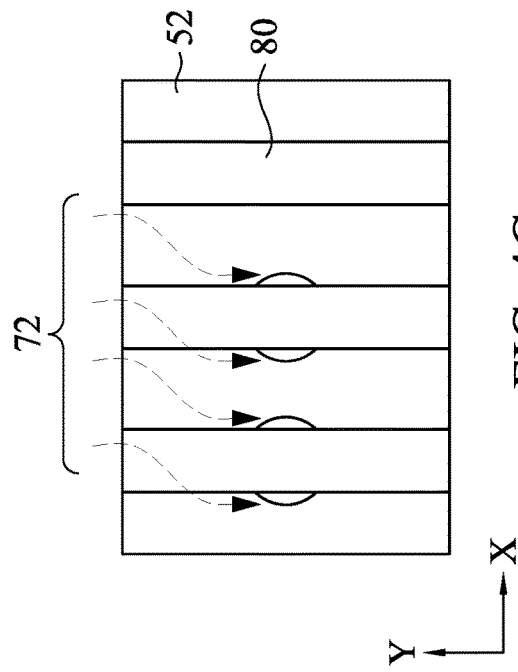
FIGS. 4A, 4B, 4C and 4D show views of the various stages of a sequential manufacturing operation of a semiconductor device in accordance with embodiments of the present disclosure.
Figure 4D:
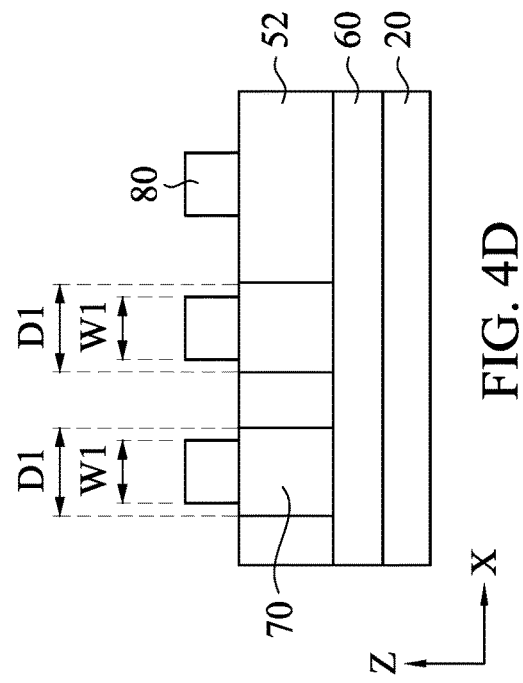
Figure 4A:
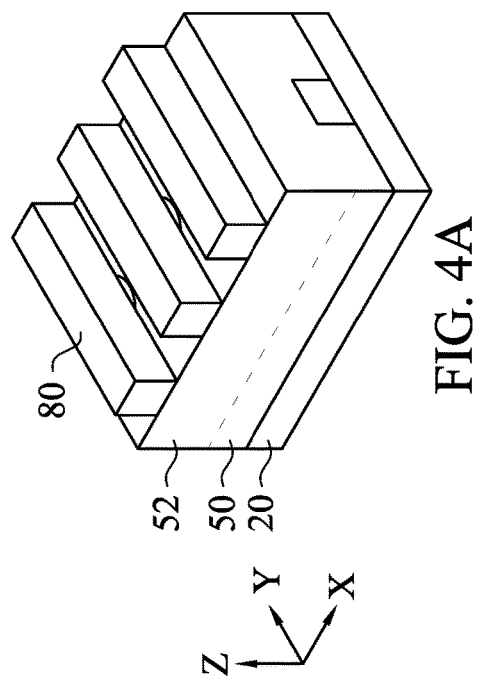
Figure 4B:
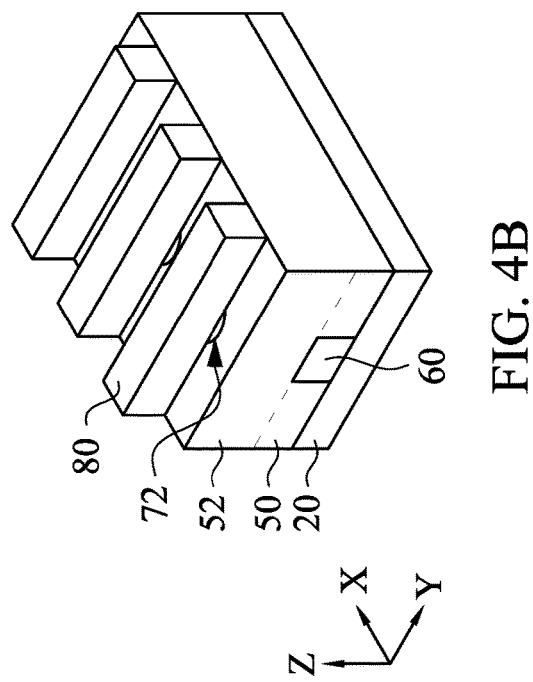
Figure 5C:
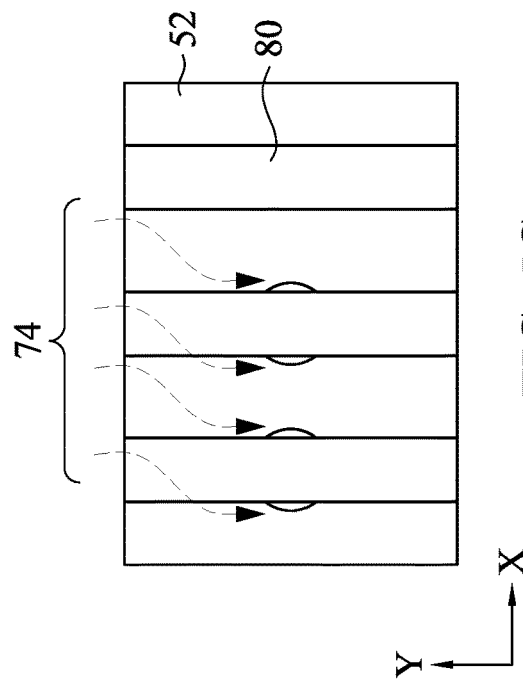
FIGS. 5A, 5B, 5C and 5D show views of the various stages of a sequential manufacturing operation of a semiconductor device in accordance with embodiments of the present disclosure.
Figure 5D:
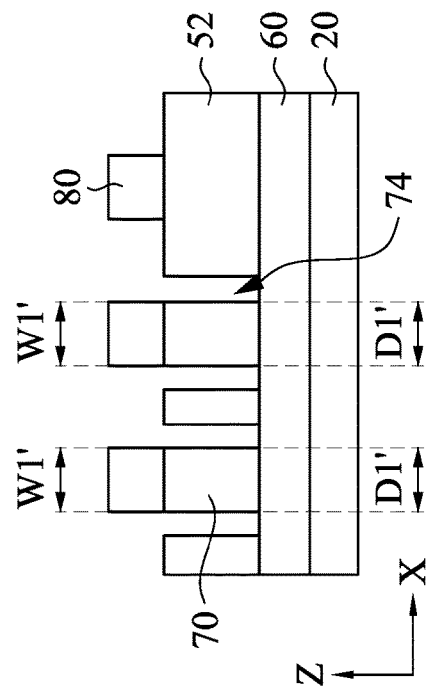
Figure 5A:
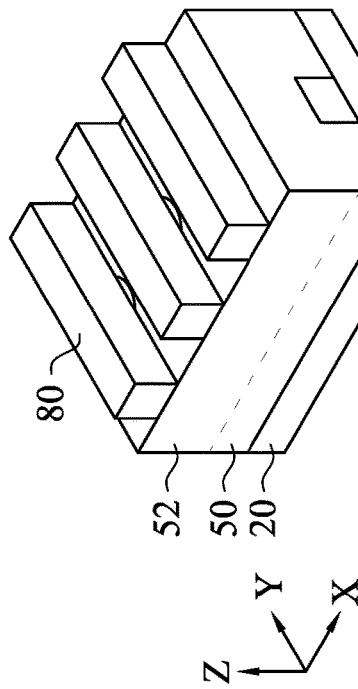
Figure 5B:
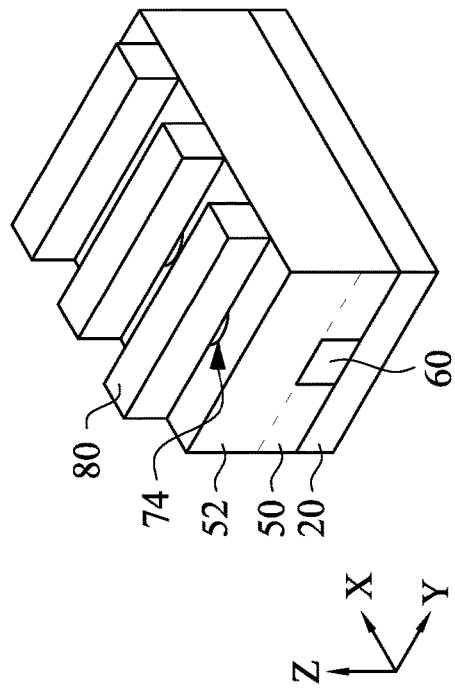
Figure 6C:
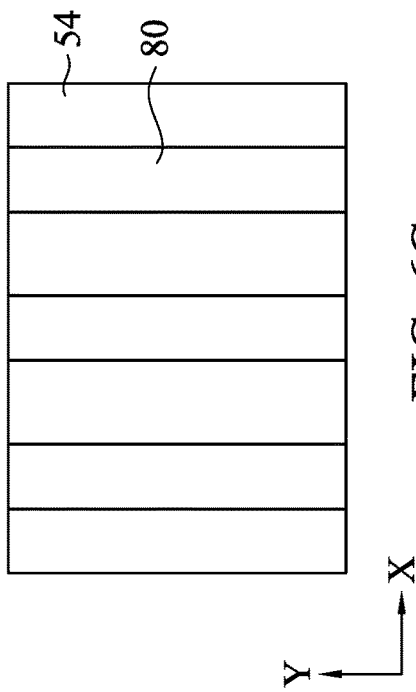
FIGS. 6A, 6B, 6C and 6D show views of the various stages of a sequential manufacturing operation of a semiconductor device in accordance with embodiments of the present disclosure.
Figure 6D:
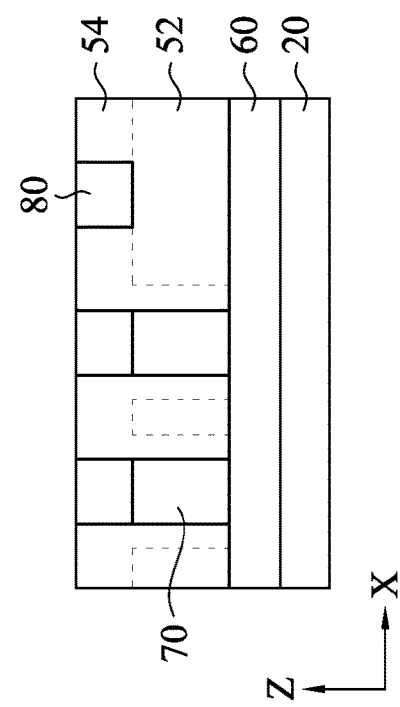
Figure 6A:
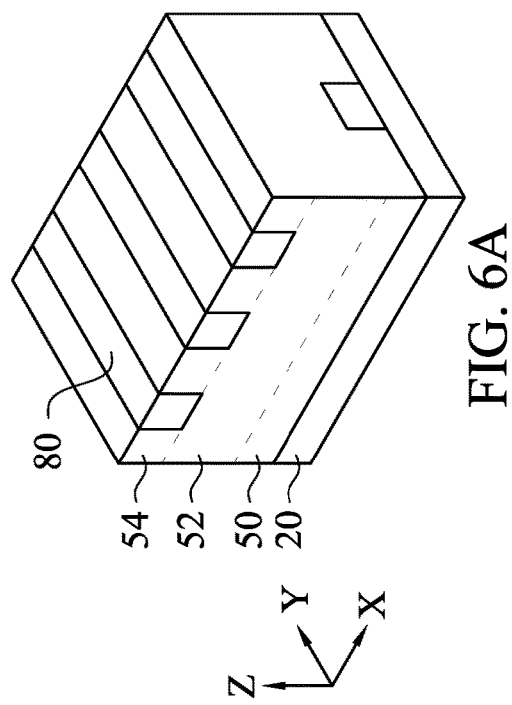
Figure 6B:
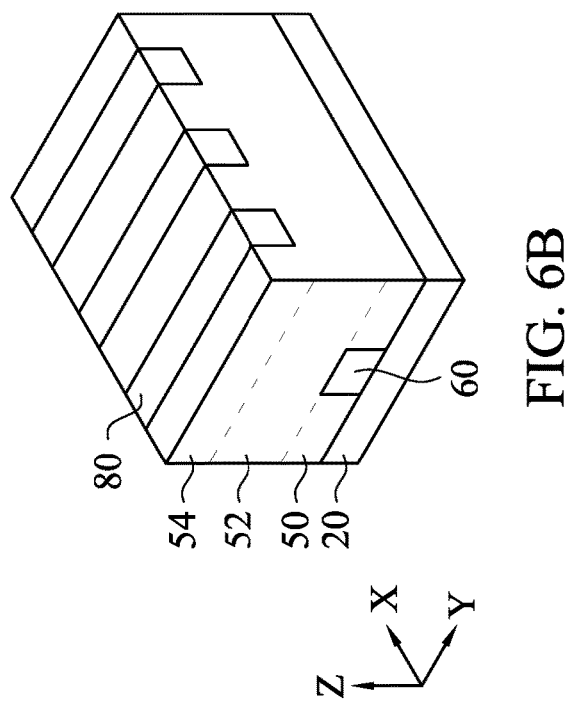

Next, as shown in FIGS. 3A and 3B, a second ILD layer 52 is formed over the first wiring pattern 60 and the first ILD layer 50. In some embodiments, the second ILD layer 52 is made of the same material as or different material from the first ILD layer 50, and includes one or more layers of silicon oxide, SiON, SiOCN, SiCN, SiOC, silicon nitride, an organic material, a low-k dielectric material, or an extreme low-k dielectric material. In some embodiments, the thickness of the second ILD layer 52 is in a range from about 20 nm to about 200 nm.

Then, one or more first via contacts (vias) 70 are formed in the second ILD layer 52. In some embodiments, the first via contacts 70 correspond to the via layer $V_x$ in FIG. 1. In some embodiments, a single damascene process is employed to form the first via contacts 70. In the single damascene process, a resist pattern having holes corresponding to the first via contacts 70 is formed over the second ILD layer 52 and the second ILD layer 52 is patterned by using plasma etching to form holes in the second ILD layer 52. Then, one or more conductive layers are formed in the holes (a filling process) and over the upper surface of the second ILD layer 52, and one or more planarization operation, such as a chemical mechanical polishing (CMP) process, is performed to remove excess portions of the conductive layers.

In some embodiments, the first via contacts 70 include one or more layers of a conductive material, such as Cu, Al, Ru, W, Co, Ti or Ta or an alloy thereof. In some embodiments, the first via contacts 70 include one or more barrier or adhesion layers (e.g., Ti, TiN, Ta and/or TaN) and one or more body layers (e.g., Cu, Ru, Co, etc.). In some embodiments, the first via contacts 70, in particular, the body layer, is made of the same material as or different material from the first wiring pattern 60. In some embodiments, the first wiring pattern 60 includes Ru and the first via contacts 70 include Cu. In some embodiments, the first via contacts 70 include a body layer and a cap layer disposed on the body layer. When the first via contact 70, in particular, the body layer, is made of a single metal element, the purity of the metal element is more than 99% in some embodiments. In some embodiments, the purity is less than 100% and the material may include an impurity, such as carbon.

In some embodiments, a diameter or a maximum width D1 along the X direction of the first via contact 70 at the upper surface thereof is in a range from about 10 nm to about 100 nm and is in a range from about 20 nm to about 40 nm in other embodiments, depending on the design requirements.

Then, as shown in FIGS. 4A-4D, one or more second wiring patterns (second conductive patterns) 80 extending in the Y direction are formed over the first via contact 70 and the second ILD layer 52. In some embodiments, one or more conductive layers as a blanket layer are formed over the second ILD layer 52 and one or more lithography and etching operations are performed to pattern the blanket layer into the second wiring patterns 80. In some embodiments, the second wiring patterns 80 correspond to the $M_{x+1}$ wiring layer of FIG. 1.

In some embodiments, the second wiring pattern 80 includes one or more layers of conductive material, such as Cu, Al, Ru, W, Co, Ti or Ta or an alloy thereof. In some embodiments, the thickness of the second wiring pattern 80 is in a range from about 20 nm to about 200 nm. When the second wiring pattern is made of a single metal element, the purity of the metal element is more than 99% in some embodiments. In some embodiments, the purity is less than 100% and the second wiring pattern may include an impurity, such as carbon. In some embodiments, Ru, Co or Cu is used. In some embodiments, the blanket layer for the second wiring pattern 80 is formed by CVD, PVD or ALD. In some embodiments, the material of the second wiring pattern 80 (when the second wiring pattern includes multiple layers, the material of the upper most layer) is different from the material of the first via contacts 70.

As shown in FIGS. 4A-4D, the width W1 of the second wiring pattern 80 along the X direction is smaller than the diameter or width D1 of the first via contact 70. Accordingly, part 72 of the upper surface of the first via contact 70 is exposed from the second wiring pattern 80 at one side or both sides of the second wiring pattern. When the second wiring pattern 80 is completely aligned with the corresponding first via contact 70, the exposed amounts of the parts 72 at both sides of the second wiring pattern are equal to each other. When the second wiring pattern 80 is mis-aligned with the corresponding first via contact 70 (i.e., there is an overlay error between the first via contact 70 and the second wiring pattern 80), the exposed amounts of the parts 72 at both sides of the second wiring pattern are different from each other reflecting the overlay error, and thus, the exposed amount at one side is greater than the exposed amount at the other side.

Then, as shown in FIGS. 5A-5D, the first via contact 70 is etched by using the second wiring pattern 80 as an etching mask. When the etching is anisotropic, the side portions of the first via contact 70 under the exposed portions 72 are substantially vertically etched, thereby forming a space 74 in the second ILD layer. In some embodiments, the etching gas in the plasma etching includes $Cl_2$ and/or $O_2$, or any other suitable etching gas. When the first and second wiring patterns are made of a different material than the first via contact 70, the plasma dry etching substantially stops at the upper surface of the first wiring pattern 60. In some embodiments, an etch stop monitor is used to detect the timing when the first wiring pattern 60 is exposed, and then the etching is stopped. After the etching, the width W1' of the second wiring pattern 80 in the X direction is substantially the same as the width D1' of the first via contact 70 in the X direction. In some embodiments, about 0.95≤W1'/D1'≤about 1.05, and in other embodiments, about 0.98≤W1'/D1'≤1.02. In some embodiments, D1' is measured at the upper surface thereof (at the interface between the first via contact 70 and the second wiring pattern 80). In some embodiments, W1' is equal to W1, and in other embodiments, W1' is about 95% to about 99% of W1.

Figure 7C:
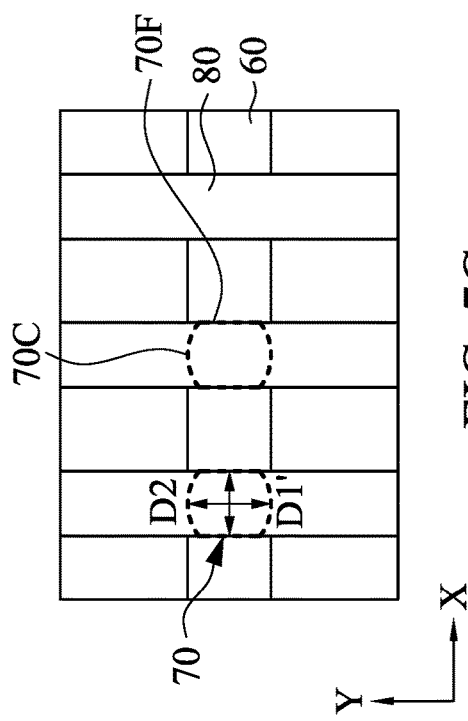
FIGS. 7A, 7B, 7C, 7D and 7E show views of the various stages of a sequential manufacturing operation of a semiconductor device in accordance with embodiments of the present disclosure.
Figure 7D:
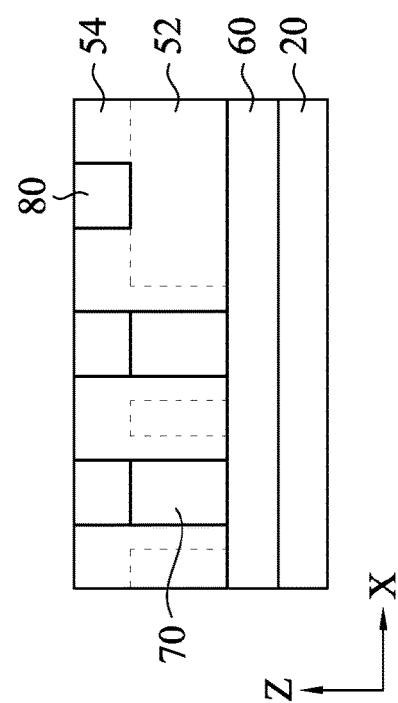
Figure 7A:
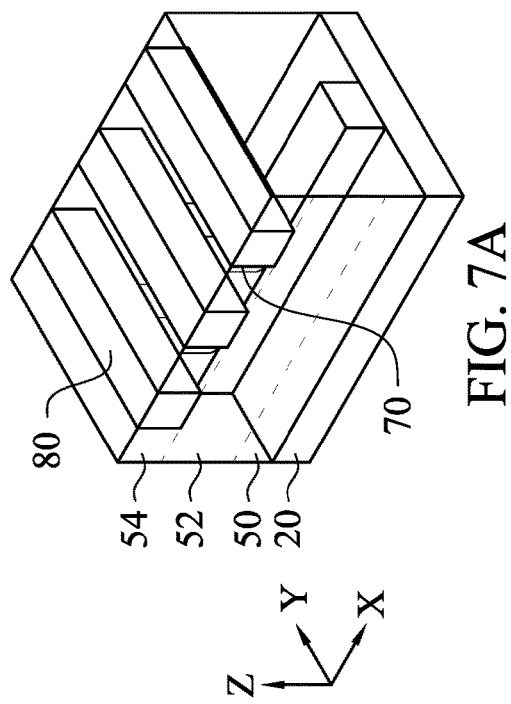
Figure 7B:
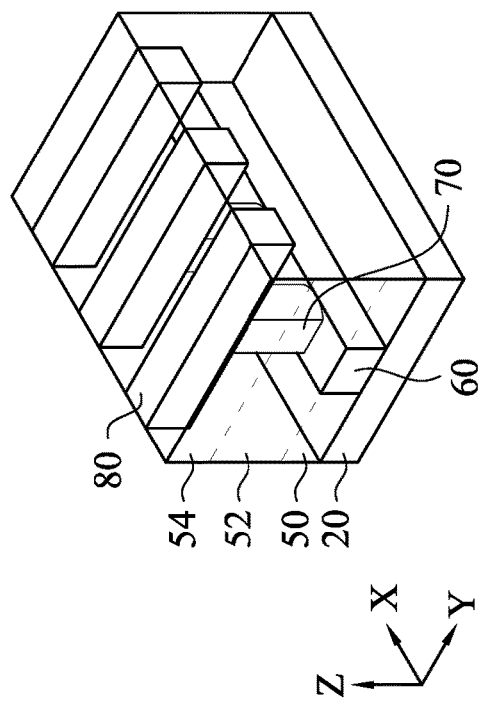
Figure 7G:
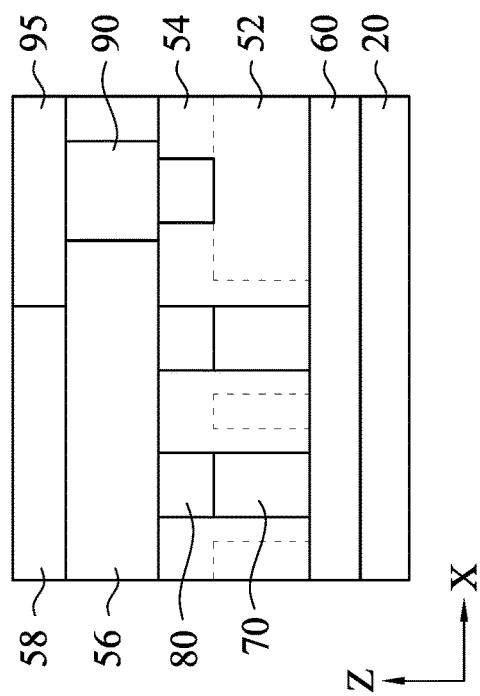
FIGS. 7F and 7G show views of the various stages of a sequential manufacturing operation of a semiconductor device in accordance with embodiments of the present disclosure.
Figure 7E:
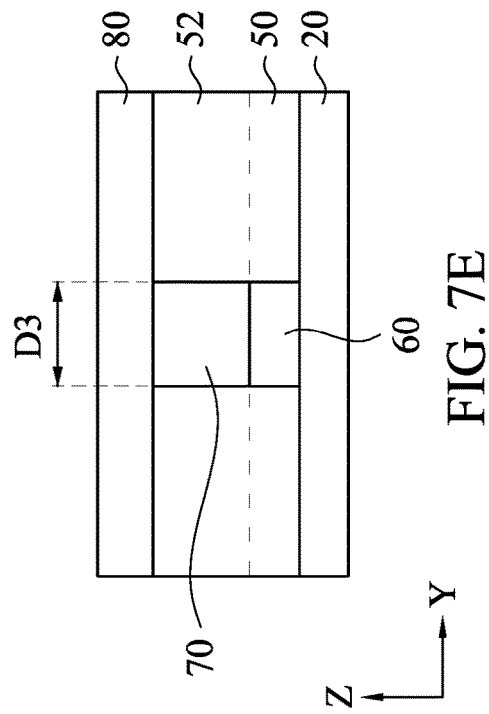

Next, as shown in FIGS. 6A-6D and FIGS. 7A-7E, a third ILD layer 54 is formed over the second ILD layer 52 and the second wiring pattern 80, and a planarization operation, such as an etch back operation or a CMP operation, is performed to expose the upper surface of the second wiring pattern 80. FIGS. 7A-7D are semi-transparent views corresponding to FIGS. 6A-6D, respectively, and FIG. 7E shows a cross section view along the Y direction.

In some embodiments, the space 74 is fully filled by the third ILD layer 53. In some embodiments, the third ILD layer 54 is made of the same material as or different material from the first ILD layer 50 and/or the second ILD layer 52, and includes one or more layers of silicon oxide, SiON, SiOCN, SiCN, SiOC, silicon nitride, an organic material, a low-k dielectric material, or an extreme low-k dielectric material. In some embodiments, the thickness of the third ILD layer 54 is in a range from about 20 nm to about 200 nm.

As shown in FIG. 7C, the first via contact 70 has substantially flat side faces 70F at both sides of the first via contact 70 along the X direction and curved side faces 70C at both sides of the first via contact 70 along the Y direction. In some embodiments, a radius of the curved face 70C is in a range from about 5 nm to about 50 nm and is in a range from about 10 nm to about 20 nm in other embodiments, depending on the design requirements. In some embodiments, the flat face 70F has a roughness Ra in a range from about 0.1 nm to about 1 nm.

As shown in FIG. 7C, in some embodiments, the width D1' of the first via contact along the X direction is smaller than the width D2, which is the same as the diameter or width D1 when the first via contact is circular in plan view, of the first via contact 70 along the Y direction. In some embodiments, D1' is about 70% to about 95% of D2.

As shown in FIG. 7E, along the Y direction the width D3 of the first via contact 70 is the same as the diameter or width D1 when the first via contact is circular in plan view.

As shown in FIGS. 7A-7E, the second wiring pattern 80 is self-aligned to the first via contact 70, and thus, even if there is an overlay error in the X direction when forming a resist pattern for the second wiring pattern, the second wiring pattern 80 is aligned with the first via contact 70 along the X direction. The space between adjacent via contacts 70 after the via contact etching shown in FIGS. 5A-5D is greater than the space between adjacent via contacts 70 as formed, which can prevent a short circuit or other undesirable failure in the semiconductor device and can reduce a parasitic capacitance between adjacent via contacts 70. In addition, since the width D3 along the Y direction does not change, it is possible to maintain a large contact area between the first via contact 70 and the second wiring pattern 80, which can reduce a contact resistance.

Figure 7F:
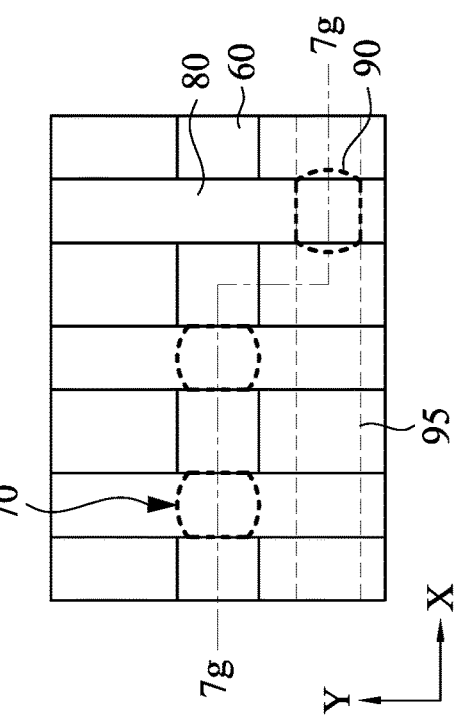

After the third ILD layer 54 is formed, similar or the same operations as explained with respect to FIGS. 3A-6D are performed to form one or more second via contacts 90 embedded in a fourth ILD layer 56 and one or more third wiring patterns 95 embedded in a fifth ILD layer 58, as shown in FIGS. 7F and 7G. FIG. 7F is a plan view (some layers are transparent) and FIG. 7G is a cross sectional view corresponding to line 7g-7g of FIG. 7F. The material of the fourth and/or fifth ILD layers is the same as or different from the first, second and/or third ILD layers as set forth above, and the materials of the second via contact and the third wiring pattern are the same as those of the first via contact and the second wiring pattern, respectively, in some embodiments.

FIGS. 8A-8E show various stages of a sequential manufacturing operation of a semiconductor device in accordance with embodiments of the present disclosure. Materials, processes, configurations and/or dimensions as explained with respect to the above embodiments are applicable to the following embodiments, and detailed explanation thereof may be omitted.

In some embodiments, when patterning the second wiring patterns 80, a hard mask pattern 85 is used as an etching mask, as shown in FIGS. 8A-8D. In some embodiments, a blanket layer for the hard mask pattern is formed over the blanket layer for the second wiring patterns. In some embodiments, the layer for the hard mask pattern 85 is made of a material different from the blanket layer for the second wiring pattern 80 and the first via contacts 70. In some embodiments, the layer for the hard mask pattern 85 includes one or more dielectric materials (e.g., silicon nitride, aluminum oxide, hafnium oxide, zirconium oxide, etc) or one or more metal or metal nitride layers, such as Ta, Ti, TaN or TiN. In some embodiments, TiN is used. In some embodiments, the layer for the hard mask pattern is formed by CVD, PVD or ALD. In some embodiments, the thickness of the hard mask pattern 85 is in a range from about 5 nm to about 100 nm, depending on the process requirements. Then, by using one or more lithography and etching operations, the blanket layer for the hard mask pattern is patterned into a hard mask pattern 85.

In other embodiments, the hard mask pattern 85 is formed by using a single damascene process. In such a case, an additional ILD layer is formed over the blanket layer for the second wiring patterns, and a resist pattern having trench openings corresponding to the hard mask pattern 85 is formed over the additional ILD layer. The additional ILD layer is patterned by using plasma etching to form trenches in the additional ILD layer, and one or more hard mask materials are formed in the trenches and the upper surface of the additional ILD layer. Then a planarization operation, such as the CMP process, is performed to expose the upper surface of the additional ILD layer. Then, the additional ILD layer is removed to leave the hard mask pattern 85 over the blanket layer for the second wiring patterns.

Figure 8C:
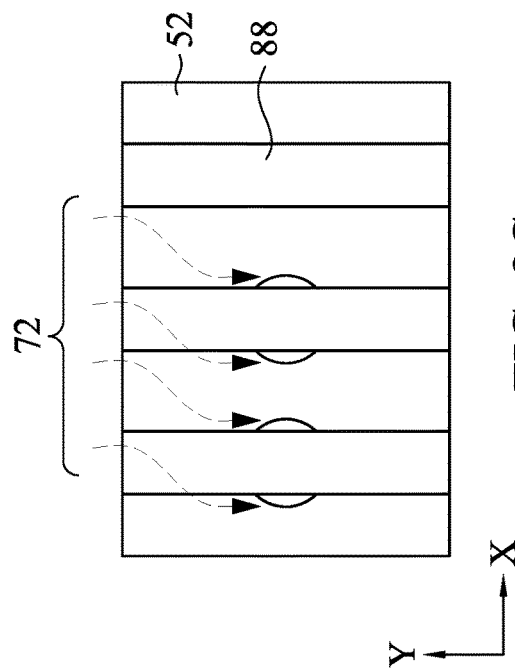
FIGS. 8A, 8B, 8C and 8D show views of the various stages of a sequential manufacturing operation of a semiconductor device in accordance with embodiments of the present disclosure.
Figure 8D:
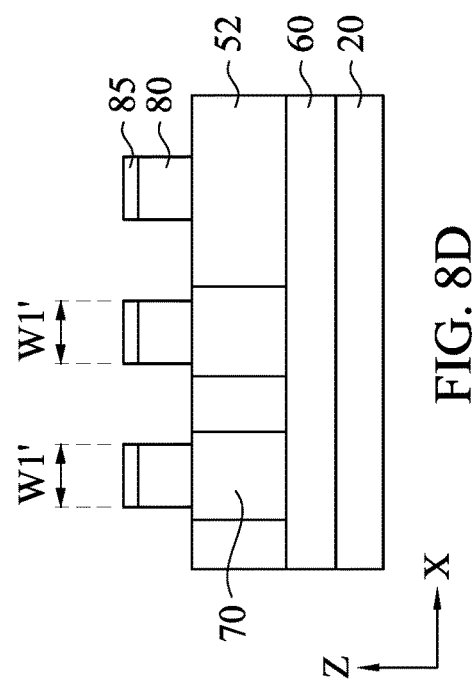
Figure 8A:
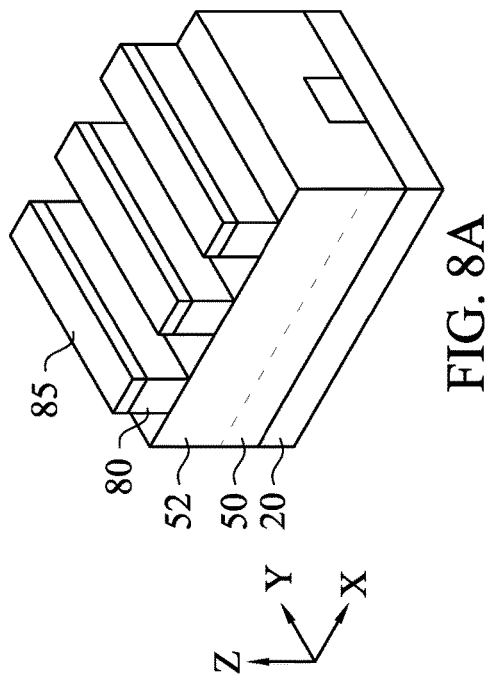
Figure 8B:
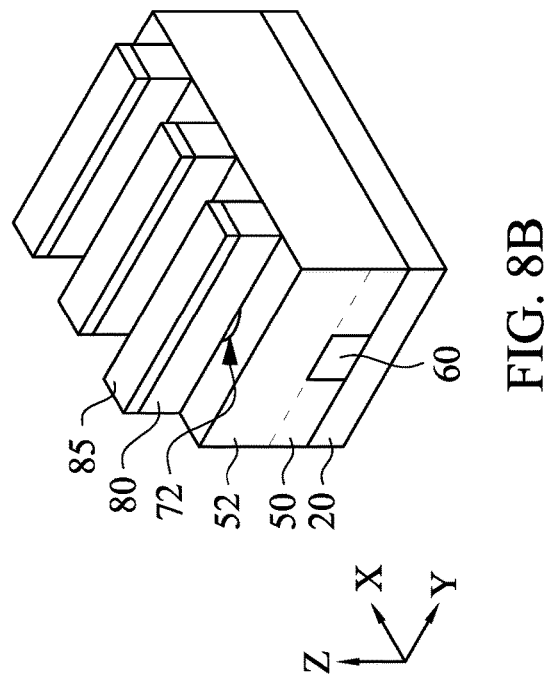
Figure 8E:
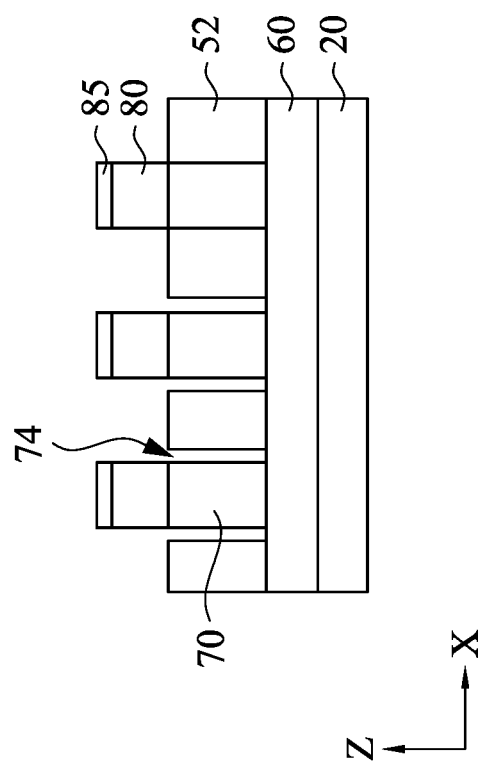
FIG. 8E shows a view of the various stages of a sequential manufacturing operation of a semiconductor device in accordance with embodiments of the present disclosure.

Next, the blanket layer for the second wiring pattern is patterned by one or more etching operations using the hard mask pattern 85 as an etching mask as shown in FIGS. 8A-8D. In some embodiments, a plasma etching process is employed. Then, similar to the operations as explained with respect to FIGS. 5A-5C, the side portions of the first via contact 70 are etched to form the spaces 74, as shown in FIG. 8E. After the spaces 74 are formed, the same operations as those explained with respect to FIGS. 6A-6D are performed to form the third ILD layer 54. In some embodiments, the hard mask pattern 85 is removed during a planarization operation, such as the CMP process, on the third ILD layer 54.

FIGS. 9A-9D show various stages of a sequential manufacturing operation of a semiconductor device in accordance with embodiments of the present disclosure. Materials, processes, configurations and/or dimensions as explained with respect to the above embodiments are applicable to the following embodiments, and detailed explanation thereof may be omitted.

Figure 9C:
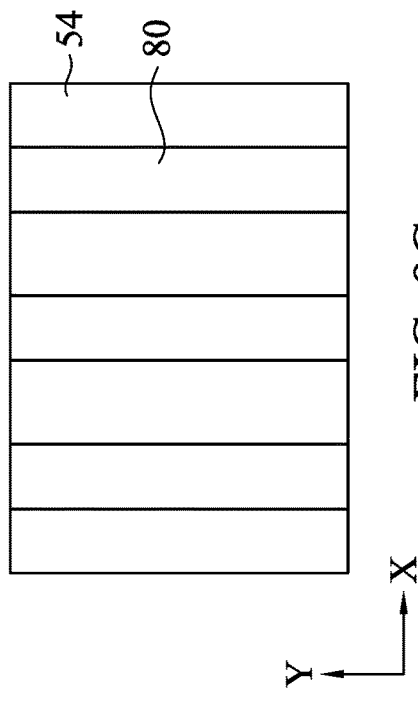
FIGS. 9A, 9B, 9C and 9D show views of the various stages of a sequential manufacturing operation of a semiconductor device in accordance with embodiments of the present disclosure.
Figure 9D:
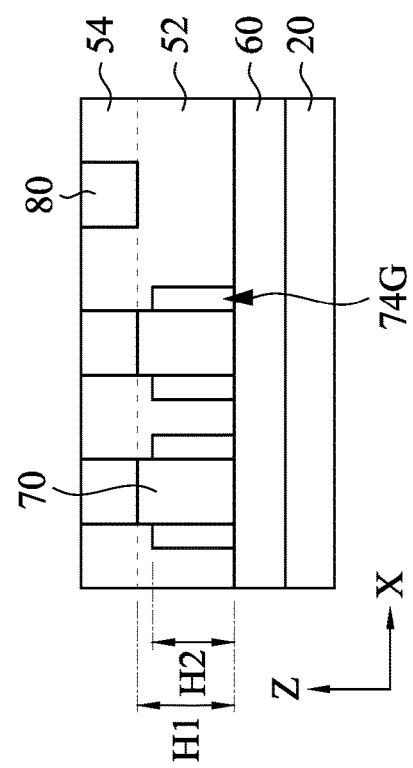
Figure 9A:
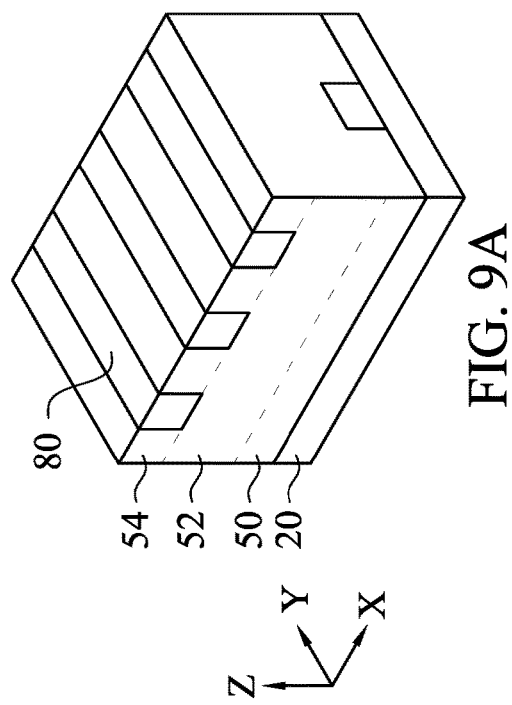
Figure 9B:
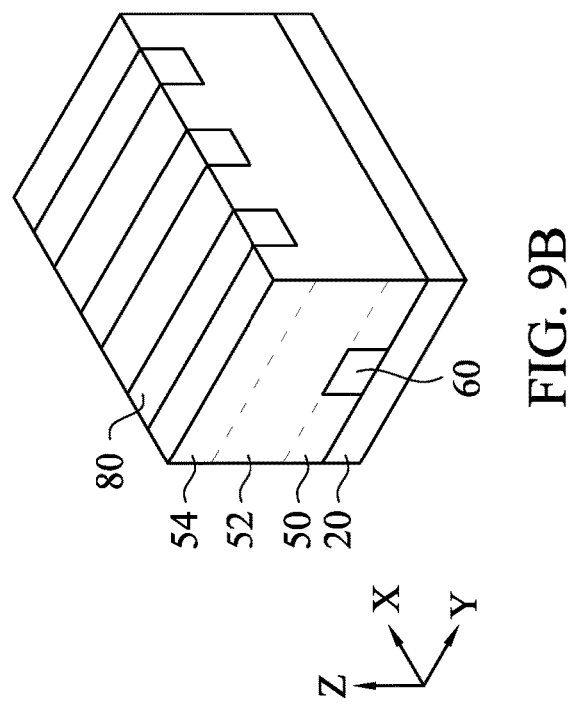

In some embodiments, when the third ILD layer 54 is formed, the spaces 74 are only partially filled (not fully filled) by the third ILD layer 54 and a gap 74G is formed at the side of the lower portion of the first via contact 70 as shown in FIG. 9D. When the height of the first via contact 70 (or the thickness of the second ILD layer 52 on the first wiring pattern 60) is H1, the height H2 of the gap 74G is about 70% to about 95% of H1. The gap is an air gap in some embodiments, which can reduce a parasitic capacitance in the wiring layers. The operations of this embodiment can be applied to the embodiments of FIGS. 8A-8E.

FIGS. 10A-10H show various stages of a sequential manufacturing operation of a semiconductor device in accordance with embodiments of the present disclosure. Materials, processes, configurations and/or dimensions as explained with respect to the above embodiments are applicable to the following embodiments, and detailed explanation thereof may be omitted.

After the structure as shown in FIGS. 4A-4D is formed, the first via contact 70 is only partially etched by using the second wiring pattern 80 (or the hard mask pattern 85) as an etching mask, thereby forming a space 74' in the second ILD layer 52. As shown in FIG. 10D, since the etching stops at the middle of the first via contact 70, the first via contact 70 has a bottom un-etched portion 70B and an upper etched portion 70U. In some embodiments, the height or the etching depth H3 is in a range from about 1% to about 70% of H1, and is in a range from about 5% to about 50% of H1 in other embodiments. In certain embodiments, H3 is about 10% to about 25% of H1. In some embodiments, the depth H3 at one side of the second wiring pattern 80 is different from the depth H1 at the other side of the second wiring pattern 80.

Figure 10G:
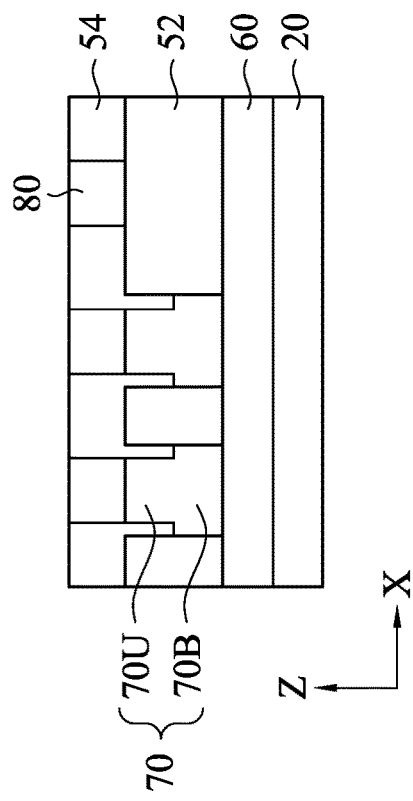
FIG. 10G shows a view of the various stages of a sequential manufacturing operation of a semiconductor device in accordance with embodiments of the present disclosure.
Figure 10H:
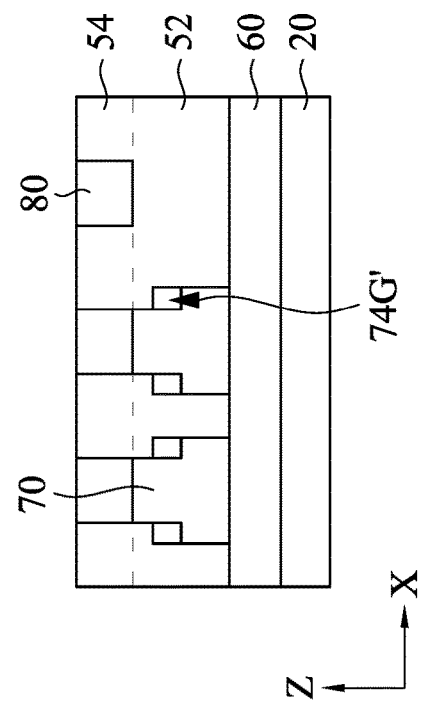
FIG. 10H shows a view of the various stages of a sequential manufacturing operation of a semiconductor device in accordance with embodiments of the present disclosure.
Figure 10E:
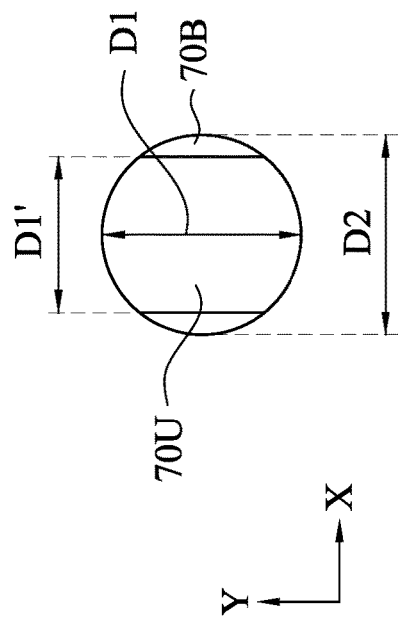
Figure 10F:
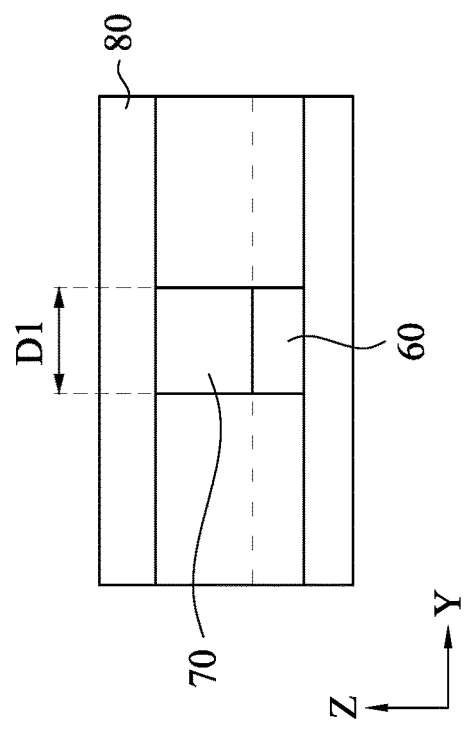
Figure 11C:
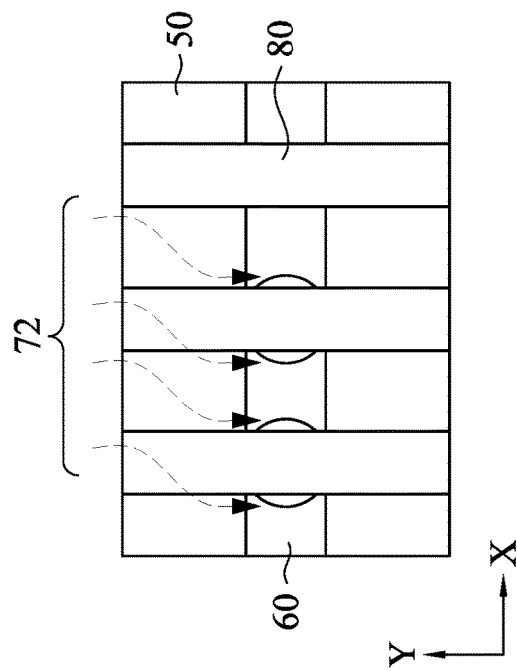
FIGS. 11A, 11B, 11C and 11D show views of the various stages of a sequential manufacturing operation of a semiconductor device in accordance with embodiments of the present disclosure.
Figure 11D:
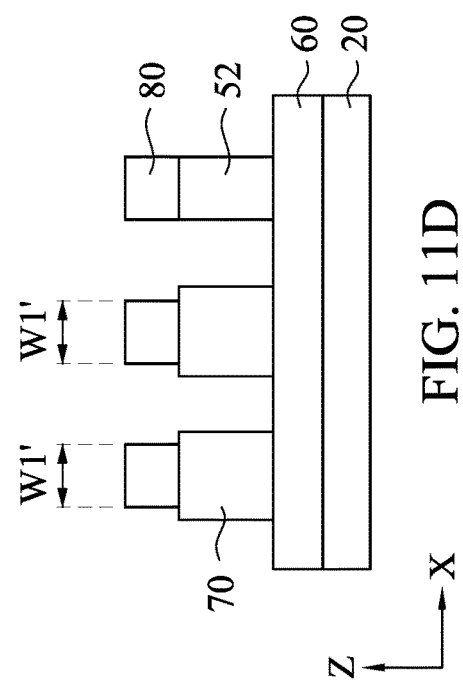
Figure 11A:
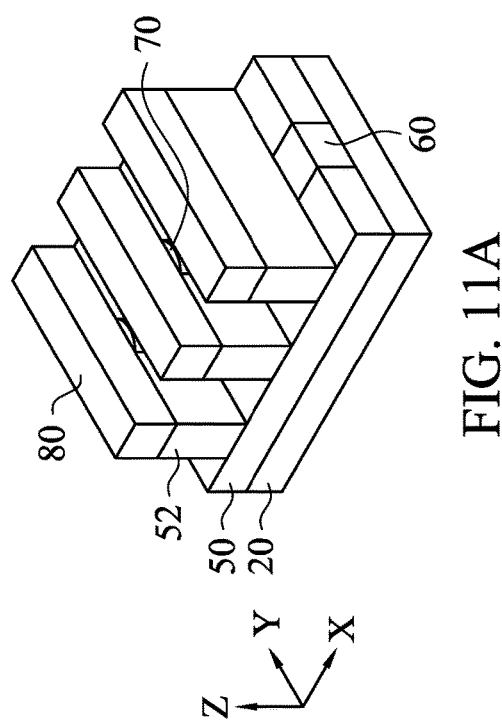
Figure 11B:
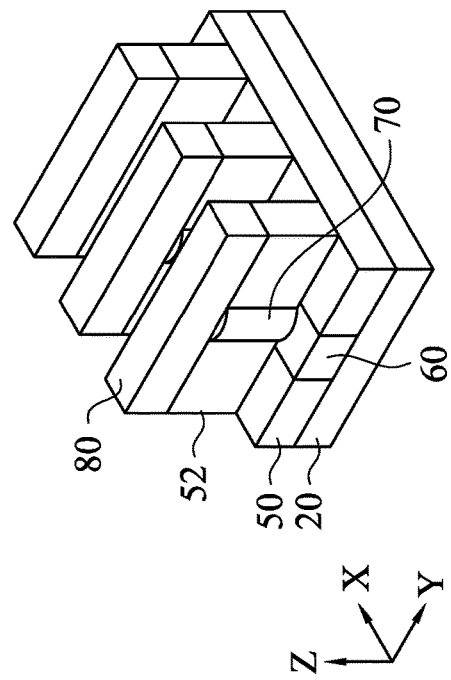

FIG. 10E is a plan (top) view and FIG. 10F is a cross sectional view along the Y direction of the first via contact 70 partially etched. As shown in FIG. 10E, in some embodiments, the width D1' of the upper portion 70U of the first via contact along the X direction is smaller than the width D2 of the bottom portion, which is the same as the diameter or width D1 when the first via contact is circular in plan view, of the first via contact 70 along the Y direction. In some embodiments, D1' is about 70% to about 95% of D2.

After the first via contact 70 is partially etched, the third ILD layer 54 is formed to fill the space 74' formed at the sides of the upper portion 70U as shown in FIG. 10G. In some embodiments, the third ILD layer 54 only partially fills the space 74' and a gap 74G' is formed at the sides of the upper portion 70U, as shown in FIG. 10H. The height of the gap 74G' is about 20% to about 80% of the height H3 of the upper portion 70U in some embodiments. The width W1' of the second wiring pattern 80 in the X direction is substantially the same as the width D1' of the upper portion 70U of the first via contact 70 in the X direction. In some embodiments, about 0.95≤W1'/D1'≤about 1.05, and in other embodiments, about 0.98≤W1'/D1'≤1.02. In some embodiments, D1' is measured at the upper surface thereof (at the interface between the first via contact 70 and the second wiring pattern 80).

FIGS. 11A-12E show various stages of a sequential manufacturing operation of a semiconductor device in accordance with embodiments of the present disclosure. Materials, processes, configurations and/or dimensions as explained with respect to the above embodiments are applicable to the following embodiments, and detailed explanation thereof may be omitted.

After the structure as shown in FIGS. 4A-4D is formed, the second ILD layer 52 is recessed (etched) down by using the second wiring patterns 80 as an etching mask, to expose the upper surface of the first wiring pattern 60 as shown in FIGS. 11A-11D. In some embodiments, a plasma dry etching process is used to remove the second ILD layer 52. The etching gas in the plasma etching includes one or more selected from the group consisting of carbon tetrafluoride ($CF_4$), difluoromethane ($CH_2F_2$), trifluoromethane ($CHF_3$), and octafluorocyclobutane ($C_4F_8$) or any proper reactants. In some embodiments, carbon dioxide ($CO_2$) is further added to the plasma source gas. Other suitable etching gases may be used. The plasma dry etching substantially stops when the first wiring pattern 60 is exposed in some embodiments. In other embodiments, the first ILD layer 50 is partially etched. As shown in FIGS. 11A-11D, the first via contact 70 is not etched during the etching of the second ILD layer 52.

Figure 12C:
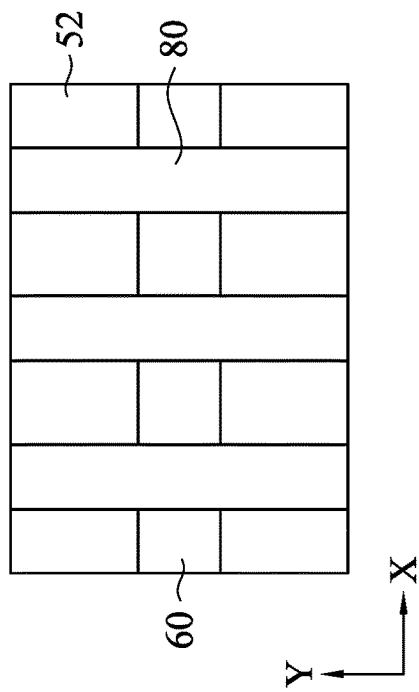
FIGS. 12A, 12B, 12C and 12D show views of the various stages of a sequential manufacturing operation of a semiconductor device in accordance with embodiments of the present disclosure.
Figure 12D:
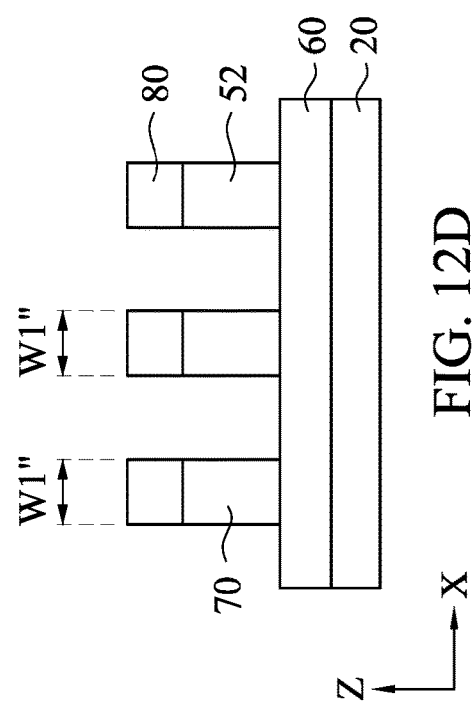
Figure 12A:
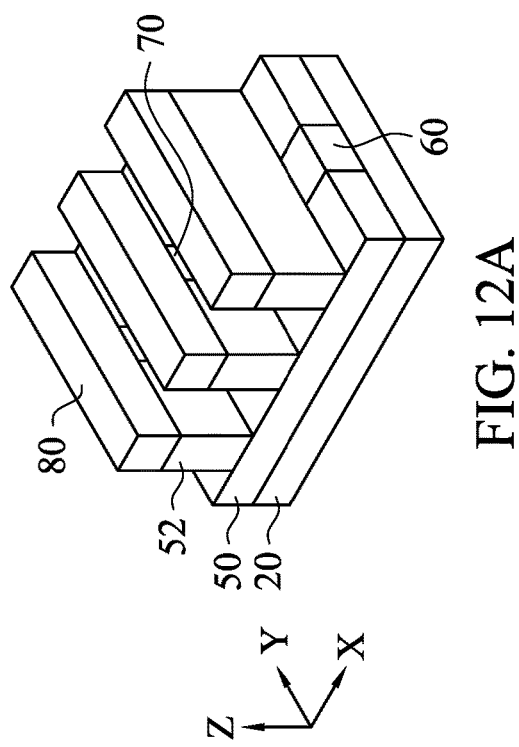
Figure 12B:
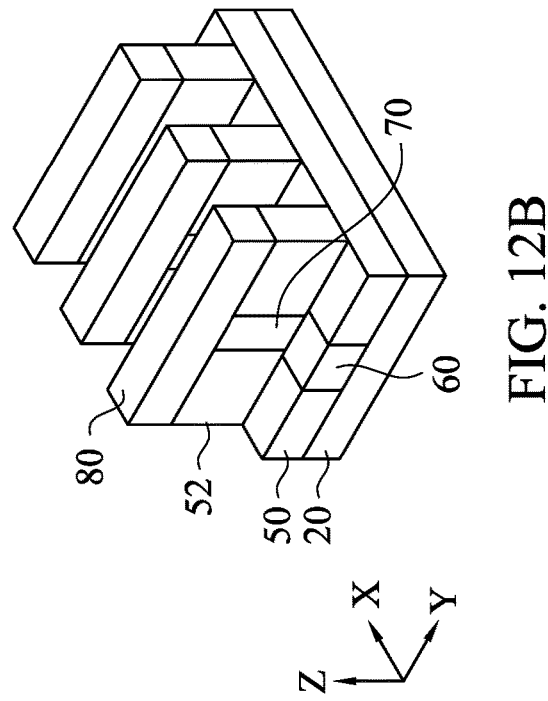
Figure 12E:
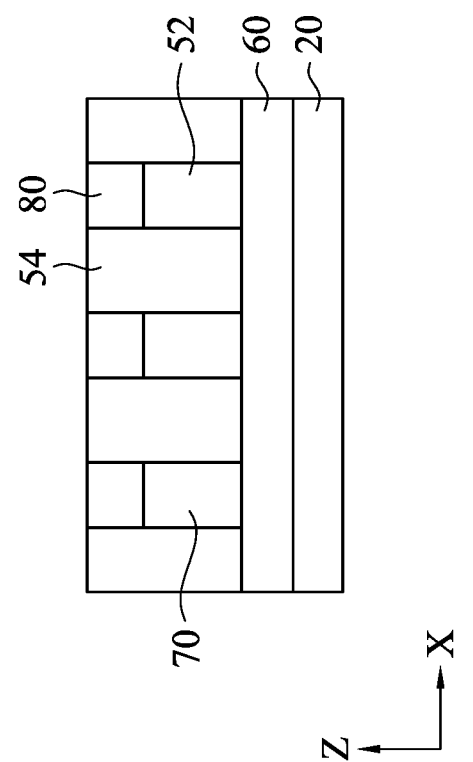
FIG. 12E shows a view of the various stages of a sequential manufacturing operation of a semiconductor device in accordance with embodiments of the present disclosure.
Figure 13C:
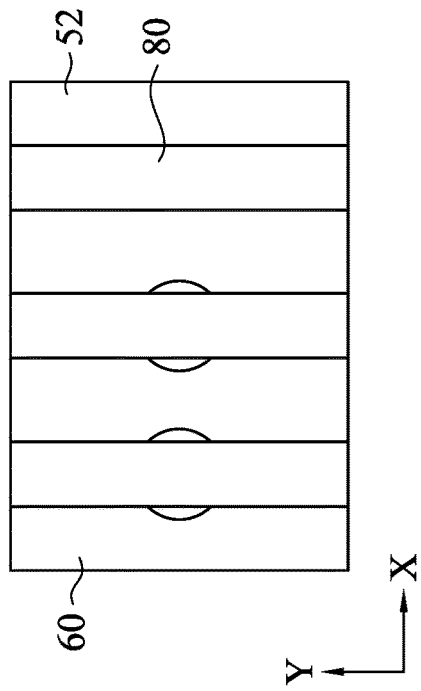
FIGS. 13A, 13B, 13C and 13D show views of the various stages of a sequential manufacturing operation of a semiconductor device in accordance with embodiments of the present disclosure.
Figure 13D:
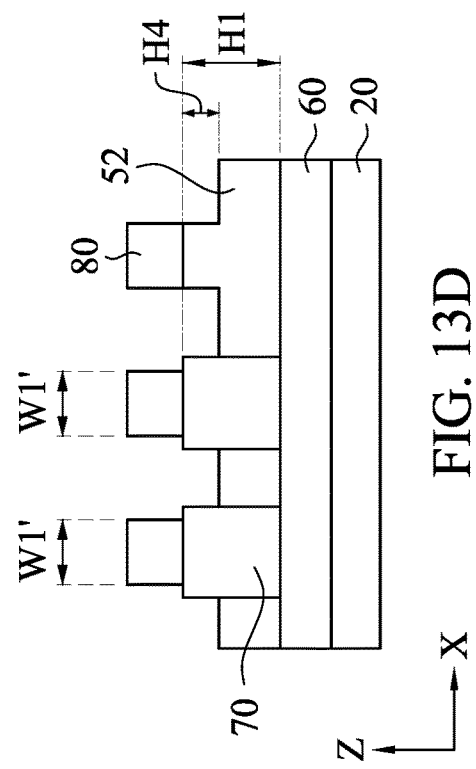
Figure 13A:
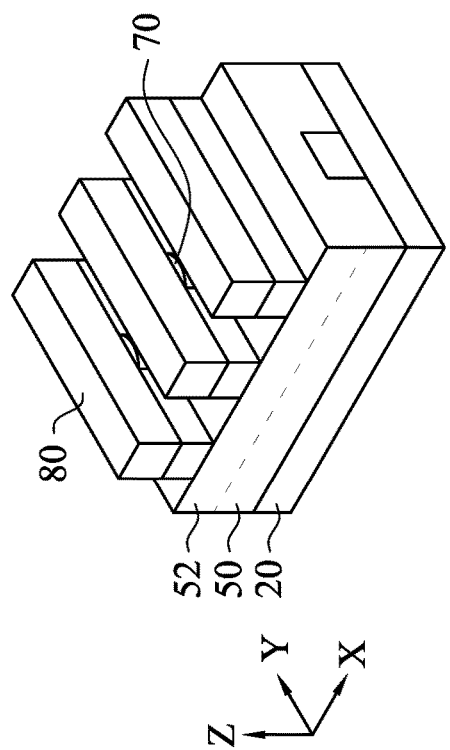
Figure 13B:
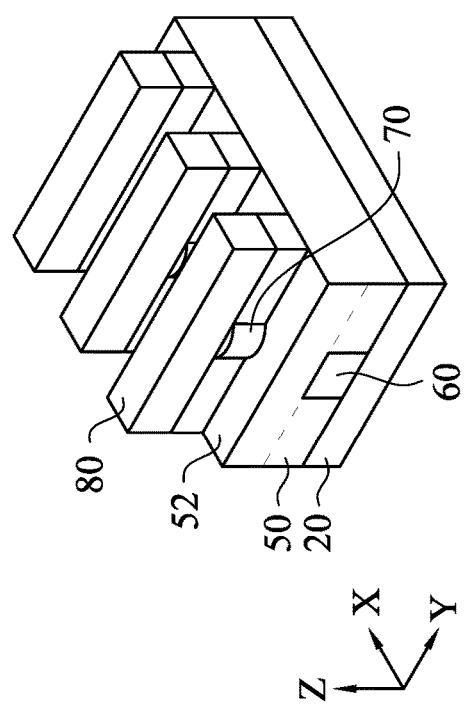

Then, as shown in FIGS. 12A-12D, the side portions protruding from the second wiring pattern 80 in plan view are etched, similar to the operations as explained with respect to FIGS. 5A-5D. Thereafter, the third ILD layer 54 is formed to fill the spaces between wall structures including the second wiring patterns and the layers below the second wiring patterns, as shown in FIG. 12E.

FIGS. 13A-14E show various stages of a sequential manufacturing operation of a semiconductor device in accordance with embodiments of the present disclosure. Materials, processes, configurations and/or dimensions as explained with respect to the above embodiments are applicable to the following embodiments, and detailed explanation thereof may be omitted.

After the structure as shown in FIGS. 4A-4D is formed, the second ILD layer 52 is recessed (etched) down by using the second wiring patterns 80 as an etching mask so as to not expose the upper surface of the first wiring pattern 60 as shown in FIGS. 13A-13D. In some embodiments, the etching depth H4 of the second ILD layer 52 is in a range from about 1% to about 70% of H1, and is in a range from about 5% to about 50% of H1 in other embodiments. In certain embodiments, H4 is about 10% to about 25% of H1.

Figure 14C:
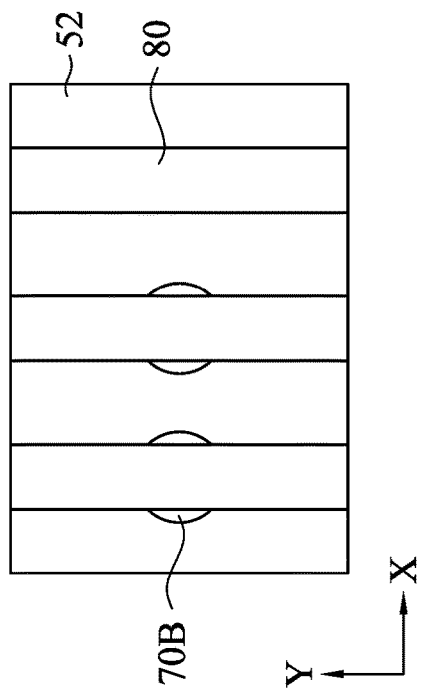
FIGS. 14A, 14B, 14C and 14D show views of the various stages of a sequential manufacturing operation of a semiconductor device in accordance with embodiments of the present disclosure.
Figure 14D:
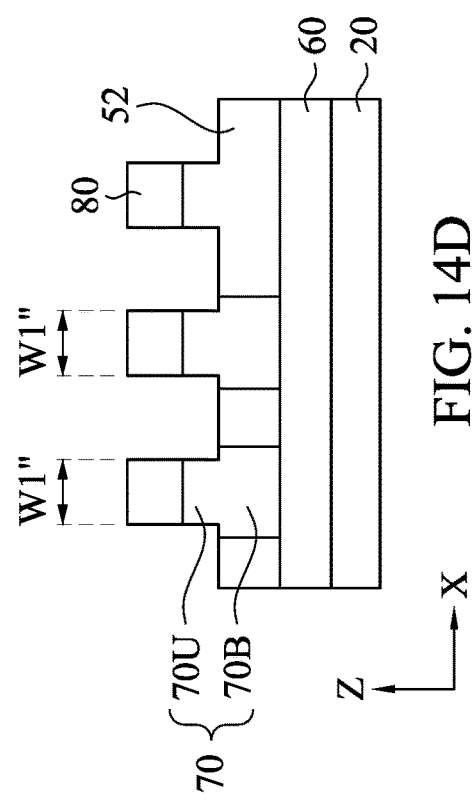
Figure 14A:
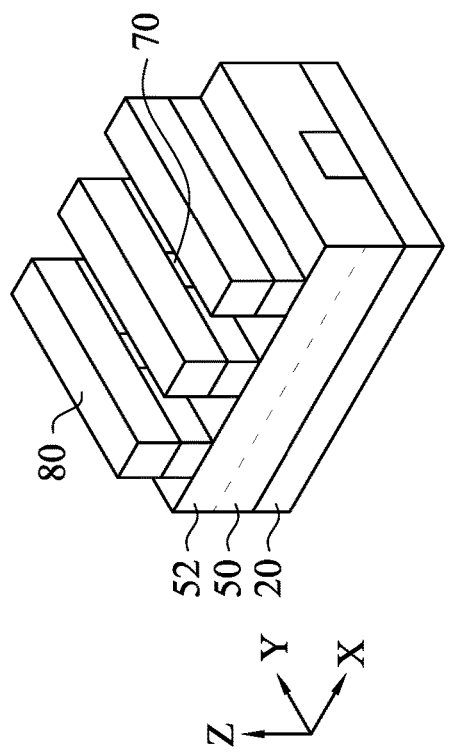
Figure 14B:
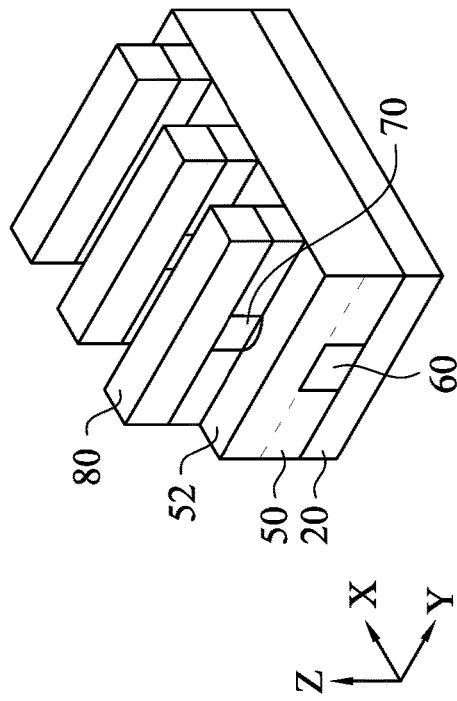
Figure 14E:
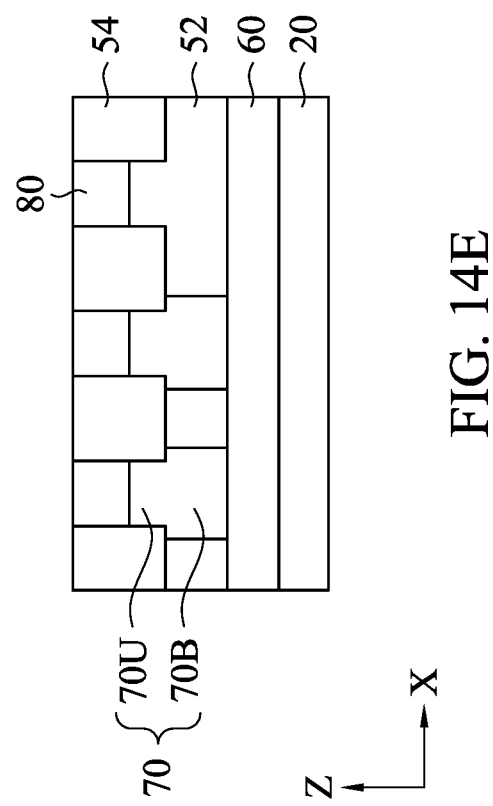
FIG. 14E shows a view of the various stages of a sequential manufacturing operation of a semiconductor device in accordance with embodiments of the present disclosure.

Then, as shown in FIGS. 14A-14D, the side portions protruding from the second wiring pattern 80 in plan view are etched to about the same level as the upper surface of the recessed second ILD layer 52, similar to the operations as explained with respect to FIGS. 5A-5D. Thereafter, the third ILD layer 54 is formed to fill the spaces between wall structures including the second wiring patterns and the layers below the second wiring patterns, as shown in FIG. 14E. In both the embodiment shown in FIG. 10 and the embodiment shown in FIG. 14E, the first via contact 70 has a similar shape having a bottom portion 70B and an upper portion 70U. However, the structures of the second ILD layer 52 and the third ILD layer 54 are different from each other, showing the different interface between the second and third ILD layers.

FIGS. 15-17C show various stages of a sequential manufacturing operation of a semiconductor device in accordance with embodiments of the present disclosure. Materials, processes, configurations and/or dimensions as explained with respect to the above embodiments are applicable to the following embodiments, and detailed explanation thereof may be omitted.

Figure 15:
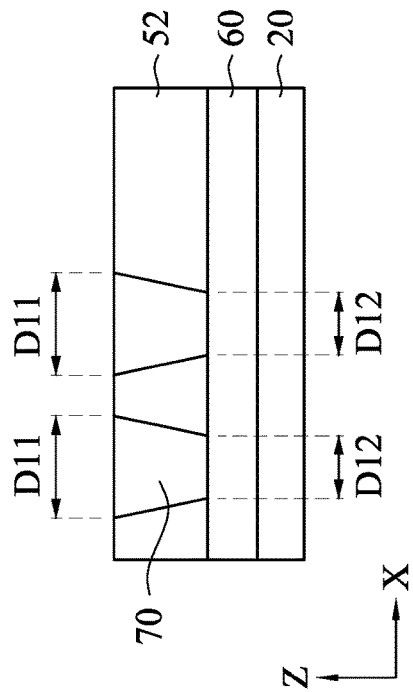
FIG. 15 shows a view of the various stages of a sequential manufacturing operation of a semiconductor device in accordance with embodiments of the present disclosure.
Figure 16B:
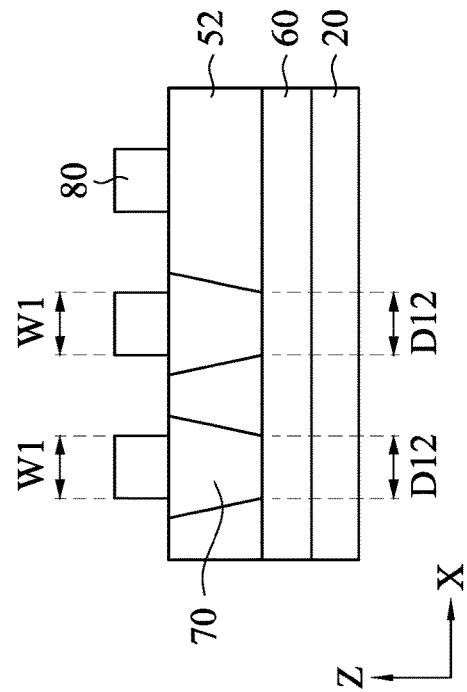
FIGS. 16A and 16B show views of the various stages of a sequential manufacturing operation of a semiconductor device in accordance with embodiments of the present disclosure.
Figure 16A:
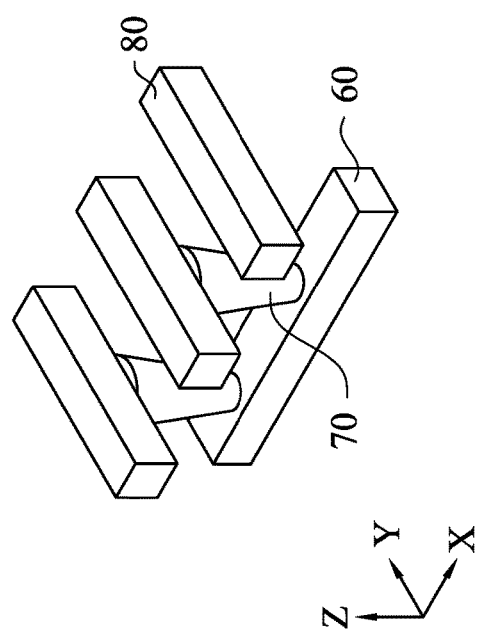

In some embodiments, the first via contact 70 has a reverse tapered (funnel) shape having a top width D11 greater than a bottom width D12, as shown in FIG. 15. In some embodiments, D12 is about 70% to about 95% of D11. FIG. 16A is a perspective view and FIG. 16B is a cross sectional view after the second wiring patterns 80 are formed. In some embodiments, the width D11 is greater than the width W1 of the second wiring pattern 80. In some embodiments, the width D12 is equal to the width W1, greater than the width W1 or smaller than the width W1.

Figure 17B:
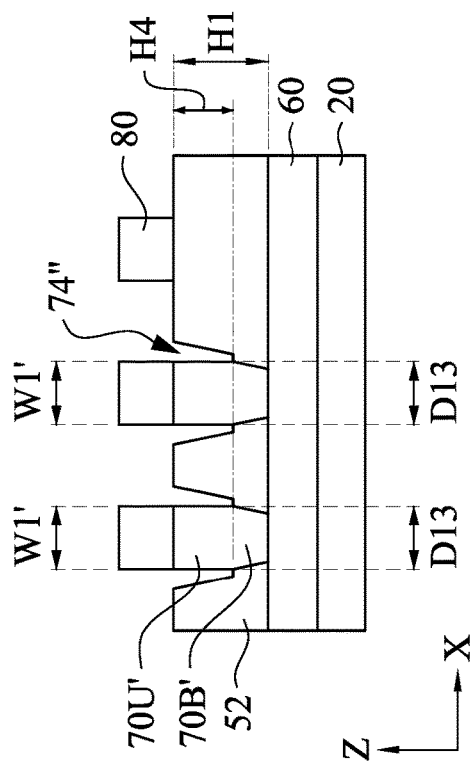
FIGS. 17A, 17B and 17C show views of the various stages of a sequential manufacturing operation of a semiconductor device in accordance with embodiments of the present disclosure.
Figure 17C:
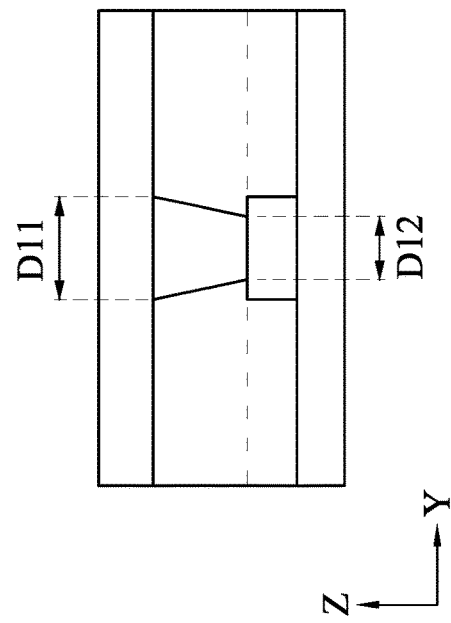
Figure 17A:
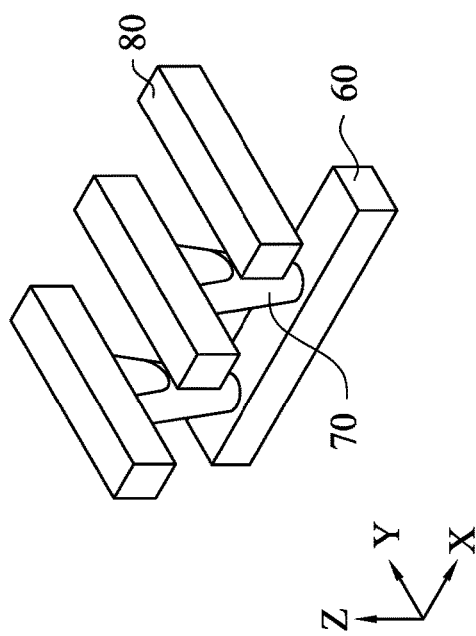

Then, similar the operations as explained with respect to FIGS. 10A-10D, the first via contact 70 is only partially etched by using the second wiring pattern 80 (or the hard mask pattern 85) as an etching mask, thereby forming a space 74″ in the second ILD layer 52, as shown in FIG. 17B. FIG. 17A is a perspective view without showing the second ILD layer 52 and FIG. 17C is a cross sectional view along the Y direction. As shown in FIG. 17B, since the etching stops at the middle of the first via contact 70, the first via contact 70 has a bottom un-etched portion 70B′ and an upper etched portion 70U′. The un-etched bottom portion 70B′ has a reverse tapered cylindrical shape and the etched upper portion 70U′ has substantially flat faces and curved faces. The flat faces have a U-shaped bottom as shown in FIG. 17A. Subsequently, the third ILD layer is formed. In some embodiments, the third ILD layer fully fills the space 74″ or partially fills the space 74″ forming a gap.

The width D13 along the X direction at the interface between the upper portion 70U′ and the bottom portion 70B′ is about 95% to about 105% of the width W1′ of the second wiring pattern 80 in some embodiments. In some embodiments, D13 is different from W1′. In the cross section along the Y direction, the reverse tapered shape of the first via contact 70 is maintained as shown in FIG. 17C. In some embodiments, the height or the etching depth H4 is in a range from about 1% to about 70% of H1, and is in a range from about 5% to about 50% of H1 in other embodiments. In certain embodiments, H4 is about 10% to about 25% of H1. In some embodiments, the depth H4 at one side of the second wiring pattern 80 is different from the depth H1 at the other side of the second wiring pattern 80.

Figure 19:
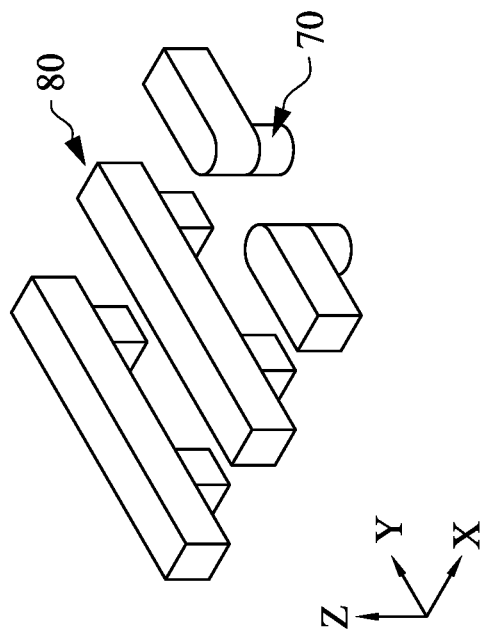
FIG. 19 shows a view of the various stages of a sequential manufacturing operation of a semiconductor device in accordance with embodiments of the present disclosure.
Figure 18:
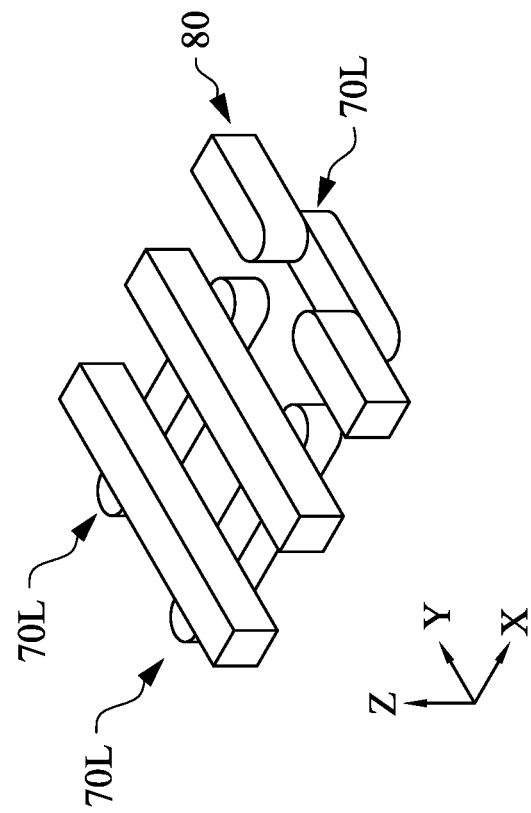
FIG. 18 shows a view of the various stages of a sequential manufacturing operation of a semiconductor device in accordance with embodiments of the present disclosure.

FIGS. 18 and 19 show various stages of a sequential manufacturing operation of a semiconductor device in accordance with embodiments of the present disclosure. Materials, processes, configurations and/or dimensions as explained with respect to the above embodiments are applicable to the following embodiments, and detailed explanation thereof may be omitted.

In the foregoing embodiments, a first via contact 70 contacts only one of the second wiring pattern 80 before etching of the first via contact. In the embodiments of FIGS. 18-19, the first via contact 70 before etching contacts two or more second wiring patterns as shown in FIG. 18. In some embodiments, the first via contact 70 has an elongated shape extending in the X direction and contact two second wiring patterns 80 extending in the Y direction. In some embodiments, the first via contact 70 has an elongated shape extending in the Y direction and contact two second wiring patterns 80 extending in the Y direction to connect end portions of the second wiring patterns 80.

The oversized first via contact 70L shown in FIG. 18 is etched by one or more operations as explained in the foregoing embodiments, to form the first via contact 70 confined under the second wiring pattern 80, as shown in FIG. 19. In some embodiments, the first via contact 70 has a quadrangular prism (four-corner column) having two flat side faces of the original shape and two flat etched side faces reflecting the sides of the second wiring pattern.

In the embodiments of the present disclosure, a via contact is partially etched by using a second wiring pattern as an etching mask, the via contact is confined with the second wiring pattern, and thus even if there is an overlay error between a mask pattern (hard mask pattern and/or resist pattern) for the second wiring pattern and the via contact, the patterned via contact has a sufficient separation from the adjacent via contact or wiring pattern. Further, since the initial via contact is formed as a larger pattern than the final pattern, process margins in lithography and/or etching operations for forming the initial via contact can be improved.

It will be understood that not all advantages have been necessarily discussed herein, no particular advantage is required for all embodiments or examples, and other embodiments or examples may offer different advantages.

In accordance with an aspect of the present disclosure, in a method of manufacturing a semiconductor device, a first conductive pattern is formed in a first interlayer dielectric (ILD) layer disposed over a substrate, a second ILD layer is formed over the first conductive pattern and the first ILD layer, a via contact is formed in the second ILD layer to contact an upper surface of the first conductive pattern, a second conductive pattern is formed over the via contact wherein a part of an upper surface of the via contact is exposed from the second conductive pattern in plan view, a part of the via contact is etched by using the second conductive pattern as an etching mask, thereby forming a space between the via contact and the second ILD layer, and a third ILD layer is formed over the second ILD layer. In one or more of the foregoing or following embodiments, the first conductive pattern extends in a first direction, and the second conductive pattern extends in a second direction crossing the first direction, and before the part of the via contact is etched, a width of the second conductive pattern above the via contact in the first direction is smaller than a largest width of the via contact in the first direction. In one or more of the foregoing or following embodiments, the part of the upper surface of the via contact is exposed at a first side of the second conductive pattern and another part of the upper surface of the via contact is exposed at a second side of the second conductive pattern, which is opposite to the first side with respect to the second conductive pattern. In one or more of the foregoing or following embodiments, the second conductive pattern is made of a different material than the via contact. In one or more of the foregoing or following embodiments, the second conductive pattern is made of a same material as the first conductive pattern. In one or more of the foregoing or following embodiments, by the etching the part of the via contact, a part of an upper surface of the first conductive pattern is exposed. In one or more of the foregoing or following embodiments, after the part of the via contact is etched, an etching depth D1 of the via contact is smaller than a height H1 of the via contact. In one or more of the foregoing or following embodiments, D1 is 1% to 50% of H1. In one or more of the foregoing or following embodiments, the space is fully filled by the third ILD layer. In one or more of the foregoing or following embodiments, the space is only partially filled by the third ILD layer so that a gap remains at a side of the via contact under the third ILD layer.

In accordance with an aspect of the present disclosure, in a method of manufacturing a semiconductor device, a first conductive pattern is formed in a first interlayer dielectric (ILD) layer disposed over a substrate, a second ILD layer is formed over the first conductive pattern and the first ILD layer, a via contact is formed in the second ILD layer to contact an upper surface of the first conductive pattern, a second conductive pattern is formed over the via contact wherein a part of an upper surface of the via contact is exposed from the second conductive pattern in plan view, a part of the via contact is etched by using the second conductive pattern as an etching mask, thereby forming a space between the via contact and the second ILD layer, and a third ILD layer is formed over the second ILD layer. In one or more of the foregoing or following embodiments, the first conductive pattern extends in a first direction, and the second conductive pattern extends in a second direction crossing the first direction, and before the part of the via contact is etched, a width of the second conductive pattern above the via contact in the first direction is smaller than a largest width of the via contact in the first direction. In one or more of the foregoing or following embodiments, the part of the upper surface of the via contact is exposed at a first side of the second conductive pattern and another part of the upper surface of the via contact is exposed at a second side of the second conductive pattern, which is opposite to the first side with respect to the second conductive pattern. In one or more of the foregoing or following embodiments, the second conductive pattern is made of a different material than the via contact. In one or more of the foregoing or following embodiments, the second conductive pattern is made of a same material as the first conductive pattern. In one or more of the foregoing or following embodiments, by the etching the part of the via contact, a part of an upper surface of the first conductive pattern is exposed. In one or more of the foregoing or following embodiments, after the part of the via contact is etched, an etching depth of the via contact is smaller than a height of the via contact. In one or more of the foregoing or following embodiments, the etching depth of the via contact is 1% to 70% of the height of the via contact. In one or more of the foregoing or following embodiments, the space is fully filled by the third ILD layer. In one or more of the foregoing or following embodiments, the space is only partially filled by the third ILD layer so that a gap remains at a side of the via contact under the third ILD layer.

In accordance with another aspect of the present disclosure, in a method of manufacturing a semiconductor device, a first conductive pattern is formed in a first interlayer dielectric (ILD) layer disposed over a substrate, a second ILD layer is formed over the first conductive pattern and the first ILD layer, a via contact is formed in the second ILD layer to contact an upper surface of the first conductive pattern, a second conductive pattern is formed over the via contact wherein part of an upper surface of the via contact is exposed from the second conductive pattern at both sides of the second conductive pattern in plan view, the part of the via contact is etched, thereby forming spaces between the via contact and the second ILD layer, and a third ILD layer is formed over the second ILD layer. In one or more of the foregoing or following embodiments, the second conductive pattern is formed by etching using a hard mask pattern as an etching mask, and the part of the via contact is etched by using the hard mask pattern as an etching mask. In one or more of the foregoing or following embodiments, the first conductive pattern extends in a first direction, and the second conductive pattern extends in a second direction crossing the first direction, and before etching the part of the via contact, a width of the second conductive pattern above the via contact in the first direction is smaller than a largest width of the via contact in the first direction. In one or more of the foregoing or following embodiments, the hard mask pattern is made of a different material than the via contact. In one or more of the foregoing or following embodiments, the second conductive pattern is made of a same material as the via contact. In one or more of the foregoing or following embodiments, the hard mask pattern is made of a different material than the first conductive pattern. In one or more of the foregoing or following embodiments, the hard mask pattern is removed.

In accordance with another aspect of the present disclosure, a semiconductor device includes transistors disposed over a substrate and a plurality of wiring layers disposed over the transistors. One of the plurality of wiring layers includes a wiring pattern and a via contact connected to a bottom surface of the wiring pattern, and the wiring pattern extends in a first direction. A width W1 of the wiring pattern above the via contact in a second direction crossing the first direction and a width W2 of the via contact in the second direction satisfy $0.98 \leq W1/W2 \leq 1.02$, and the width W2 is smaller than a largest width W3 of the via contact in the first direction. In one or more of the foregoing or following embodiments, the width W1 is smaller than the width W3. In one or more of the foregoing or following embodiments, first side faces of the via contact are curved surfaces. In one or more of the foregoing or following embodiments, the curved surfaces have a radius in a range from 5 nm to 20 nm. In one or more of the foregoing or following embodiments, second side faces of the via contact are flush with side faces extending in the first direction of the wiring pattern. In one or more of the foregoing or following embodiments, a width in the first direction of one of the second side faces is different from a width in the first direction of another of the second side faces. In one or more of the foregoing or following embodiments, the wiring pattern is made of a different material than the via contact. In one or more of the foregoing or following embodiments, the semiconductor device further includes a gap at a side of a lower portion of the via contact. In one or more of the foregoing or following embodiments, a side of an upper portion of the via contact is covered by a dielectric layer.

In accordance with another aspect of the present disclosure, a semiconductor device includes transistors disposed over a substrate and a plurality of wiring layers disposed over the transistors. One of the plurality of wiring layers includes a wiring pattern extending in a first direction and a via contact connected to a bottom surface of the wiring pattern, and the via contact comprises a lower portion and an upper portion. A width W11 of the upper portion in a second direction crossing the first direction is smaller than a width W12 of the lower portion in the second direction. In one or more of the foregoing or following embodiments, a width W13 of the wiring pattern above the via contact in the second direction and the width W11 of the upper portion of the via contact in the second direction satisfy $0.98 \leq W13/W11 \leq 1.02$. In one or more of the foregoing or following embodiments, the width W13 is smaller than the width W12. In one or more of the foregoing or following embodiments, a largest width W14 of the upper portion in the first direction and a largest width W15 of the lower portion in the first direction satisfy $0.98 \leq W14/W15 \leq 1.02$. In one or more of the foregoing or following embodiments, the width W14 and the width W15 are greater than the width W13. In one or more of the foregoing or following embodiments, a height of the lower portion is 50% to 99% of a height of the via contact. In one or more of the foregoing or following embodiments, the semiconductor device further includes a gap at a side of the upper portion of the via contact.

In accordance with another aspect of the present disclosure, a semiconductor device includes transistors disposed over a substrate and a plurality of wiring layers disposed over the transistors. The plurality of wiring layers includes an n-th wiring layer and an (n+1)-th wiring layer, the n-th wiring layer includes a first wiring pattern extending in a first direction and a first via contact connected to an upper surface of the first wiring pattern, and the (n+1)-th wiring layer includes a second wiring pattern extending in a second direction crossing the first direction and connected to the first via contact at a bottom surface of the second wiring pattern. A width W1 of the second wiring pattern above the first via contact in the first direction and a width W2 of the first via contact in the first direction at an interface between the second wiring pattern and the first via contact satisfy 0.98≤W1/W2≤1.02, and the width W2 is smaller than a largest width W3 of the via contact in the second direction. In one or more of the foregoing or following embodiments, a width W4 of the first via contact in the first direction at an interface between the first wiring pattern and the first via contact is smaller than W2. In one or more of the foregoing or following embodiments, a center of the first via contact at the interface between the first wiring pattern and the first via contact is mis-aligned with a center of the first via contact at the inter face between the second wiring pattern and the first via contact, in the first direction. In one or more of the foregoing or following embodiments, the first via contact comprises a lower portion and an upper portion, and the upper portion comprises at least one flat side face, and the lower portion has no flat side face. In one or more of the foregoing or following embodiments, the upper portion comprises two flat side faces and two curved side faces.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a semiconductor device comprising:
   forming a first conductive pattern in a first interlayer dielectric (ILD) layer disposed over a substrate;
   forming a second ILD layer over the first conductive pattern and the first ILD layer;
   forming a via contact in the second ILD layer to contact an upper surface of the first conductive pattern;
   forming a second conductive pattern over the via contact wherein a part of an upper surface of the via contact is exposed from the second conductive pattern in plan view;
   etching the part of the upper surface of the via contact by using the second conductive pattern as an etching mask, thereby forming a space between the via contact and the second ILD layer; and
   forming a third ILD layer over the second ILD layer.

2. The method of claim 1, wherein:
   the first conductive pattern extends in a first direction, and
   the second conductive pattern extends in a second direction crossing the first direction, and
   before etching the part of the via contact, a width of the second conductive pattern above the via contact in the first direction is smaller than a largest width of the via contact in the first direction.

3. The method of claim 2, wherein the part of the upper surface of the via contact is exposed at a first side of the second conductive pattern and another part of the upper surface of the via contact is exposed at a second side of the second conductive pattern, which is opposite to the first side with respect to the second conductive pattern.

4. The method of claim 1, wherein the second conductive pattern is made of a different material than the via contact.

5. The method of claim 4, wherein the second conductive pattern is made of a same material as the first conductive pattern.

6. The method of claim 1, wherein by the etching the part of the via contact, a part of an upper surface of the first conductive pattern is exposed.

7. The method of claim 1, wherein after the etching the part of the via contact, an etching depth of the via contact is smaller than a height of the via contact.

8. The method of claim 7, wherein the etching depth of the via contact is 1% to 70% of the height of the via contact.

9. The method of claim 1, wherein the space is fully filled by the third ILD layer.

10. The method of claim 1, wherein the space is only partially filled by the third ILD layer so that a gap remains at a side of the via contact under the third ILD layer.

11. A method of manufacturing a semiconductor device comprising:
    forming a first conductive pattern in a first interlayer dielectric (ILD) layer disposed over a substrate;
    forming a second ILD layer over the first conductive pattern and the first ILD layer;
    forming a via contact in the second ILD layer to contact an upper surface of the first conductive pattern;
    forming a second conductive pattern over the via contact wherein a part of an upper surface of the via contact is exposed from the second conductive pattern at both sides of the second conductive pattern in plan view;
    etching the part of the via contact, thereby forming spaces between the via contact and the second ILD layer; and
    forming a third ILD layer over the second ILD layer, wherein:
    the second conductive pattern is formed by etching using a hard mask pattern as an etching mask, and
    the part of the via contact is etched by using the hard mask pattern as an etching mask.

12. The method of claim 11, wherein:
    the first conductive pattern extends in a first direction, and
    the second conductive pattern extends in a second direction crossing the first direction, and
    before etching the part of the via contact, a width of the second conductive pattern above the via contact in the first direction is smaller than a largest width of the via contact in the first direction.

13. The method of claim 11, wherein the hard mask pattern is made of a different material than the via contact.

14. The method of claim 11, wherein the second conductive pattern is made of a same material as the via contact.

15. The method of claim 11, wherein the hard mask pattern is made of a different material than the first conductive pattern.

16. The method of claim 11, further comprising removing the hard mask pattern.

17. A method of manufacturing a semiconductor device comprising:
    forming a first conductive pattern in a first interlayer dielectric (ILD) layer disposed over a substrate;
    forming a second ILD layer over the first conductive pattern and the first ILD layer;
    forming a via contact in the second ILD layer to contact an upper surface of the first conductive pattern;

forming a second conductive pattern over the via contact wherein a part of an upper surface of the via contact is exposed from the second conductive pattern in plan view;

etching the second ILD layer to expose at least a part of a side face of the via contact;

etching the part of the upper surface of the via contact by using the second conductive pattern as an etching mask; and forming a third ILD layer over the second ILD layer.

18. The method of claim 17, wherein the second ILD layer is etched such that a part of an upper surface of the first conductive pattern is exposed.

19. The method of claim 17, wherein the second ILD layer is etched such that no part of an upper surface of the first conductive pattern is exposed.

20. The method of claim 19, wherein the part of the via contact is etched such that no part of an upper surface of the first conductive pattern is exposed.

* * * * *